US008568877B2

(12) United States Patent
Ferrari et al.

(10) Patent No.: US 8,568,877 B2
(45) Date of Patent: Oct. 29, 2013

(54) POROUS AND NON-POROUS NANOSTRUCTURES

(75) Inventors: Mauro Ferrari, Houston, TX (US); Xuewu Liu, Sugarland, TX (US); Ciro Chiappini, Austin, TX (US); Jean Raymond Fakhoury, Round Rock, TX (US)

(73) Assignee: Board of Regents of the University of Texas System, Austin, TX (US)

( * ) Notice: Subject to any disclaimer, the term of this patent is extended or adjusted under 35 U.S.C. 154(b) by 32 days.

(21) Appl. No.: 13/044,250

(22) Filed: Mar. 9, 2011

(65) Prior Publication Data

US 2011/0266521 A1 Nov. 3, 2011

Related U.S. Application Data

(60) Provisional application No. 61/282,627, filed on Mar. 9, 2010.

(51) Int. Cl.
*H01L 21/311* (2006.01)

(52) U.S. Cl.
USPC .......................... 428/402; 438/690; 438/695

(58) Field of Classification Search
USPC .................................. 428/402; 438/960, 965
See application file for complete search history.

(56) References Cited

U.S. PATENT DOCUMENTS

| 2003/0114366 | A1 | 6/2003 | Martin et al. | |
|---|---|---|---|---|
| 2008/0280140 | A1* | 11/2008 | Ferrari et al. | 428/402 |
| 2008/0311182 | A1 | 12/2008 | Ferrari et al. | |

FOREIGN PATENT DOCUMENTS

| WO | 9953898 | 10/1999 |
|---|---|---|
| WO | 2008021908 | 2/2008 |
| WO | 2010082910 | 7/2010 |

OTHER PUBLICATIONS

Bisi, O., et al., "Porous silicon: a quantum sponge structure for silicon based optoelectronics," Surf Sci. Rep. 38, 1 (2000).
Lehmann, V. & Gosele, U., "Porous silicon formation: A quantum wire effect," Appl. Phys. Lett. 58, 856-858 (1991).
Wolkin, M.V., et al., "Electronic States and Luminescence in Porous Silicon Quantum Dots: The Role of Oxygen," Phys. Rev. Lett. 82, 197 (1999).
Dorvee, J.R., et al., "Manipulation of liquid droplets using amphiphilic, magnetic one-dimensional photonic crystal chaperones," Nat. Mater. 3, 896-899 (2004).
Lin, V.S., et al., "A Porous Silicon-Based Optical Interferometric Biosensor," Science 278, 840-843 (1997).

(Continued)

*Primary Examiner* — Howard Weiss
*Assistant Examiner* — Steven Rao
(74) *Attorney, Agent, or Firm* — Winstead PC

(57) ABSTRACT

Disclosed are a variety of porous and non-porous wire-like structures of microscopic and nanoscopic scale. For instance, disclosed are structures that comprise a porous object that comprises: (i) a first region; and (ii) a second region adjacent to the first region along an axis of the object, where the first region has at least one porous property different from that of the second region. Also disclosed are structures that include: (i) a high resistivity silicon; and (ii) a cross-section that is substantially perpendicular to an axis of the object. Also disclosed are methods of making and using such structures. For instance, the present invention provides methods of making a porous object by: (i) obtaining an etchable substrate; (ii) forming on a surface of the substrate a patterned porosification assisting metal layer that has at least one opening; and (iii) subsequently exposing the substrate to a first etching solution and a second etching solution to form respectively a first region and a second region of a porous object.

70 Claims, 23 Drawing Sheets

(56) References Cited

OTHER PUBLICATIONS

Pancheri, L., et al., "Very Sensitive Porous Silicon NO2 Sensor," Sens. Actuators, B: Chemical 89, 237-239 (2003).

Shen, Z. et al., "Porous Silicon as a Versatile Platform for Laser Desorption/Ionization Mass Spectrometry," Anal. Chem. 73, 612-619 (2001).

Park, J. et al., "Biodegradable luminescent porous silicon nanoparticles for in vivo applications," Nat. Mater. 8, 331-336 (2009).

Serda, R., et al., "Porous Silicon Particles for Imaging and Therapy of Cancer," Nanomaterials for the Life Sciences vol. 2: Nanostructured Oxides (ed. C.S.S.R. Kumar) Ch 11, 359-408 (Wiley-WCH, Weinheim, 2009).

Starodub, V.M., et al., "Control of myoglobin level in a solution by an immune sensor based on the photoluminescence of porous silicon," Sens. Actuators, B 58, 409-414 (1999).

Canham, L.T., "Bioactive Silicon Structure Fabrication Through Nanoetching Techniques," Adv. Mater. 7, 1033-1037 (1995).

Canham, L. et al., "Derivatized Porous Silicon Mirrors: Implantable Optical Components with Slow Resorbability," Phys. Status Solidi A 182, 521-525 (2000).

Goh, A.S.W. et al., "A novel approach to brachytherapy in hepatocellular carcinoma using a phosphorous32 (32P) brachytherapy delivery device—a first-in-man study," Int. J.Radiat. Oncol. Biol. Phys. 67, 786-792 (2007).

Tasciotti, E. et al., "Mesoporous silicon particles as a multistage delivery system for imaging and therapeutic applications," Nature Nanotechnol. 3, 151-157 (2008).

Chiappini, C. et. al., "Tailored porous silicon microparticles: fabrication and properties," ChemPhysChem, accepted, doi:10.1002/cphc.200900914.

Setzu, S. et al., "Porous silicon-based potentiometric biosensor for triglycerides," phys. stat. sol. (a) 204, No. 5, 1434-1438 (2007) / DOI 10.1002/pssa.200674378.

Mayne, A.H. et al, "Biologically Interfaced Porous Silicon Devices," Phys. Status Solidi A 182, 505-513 (2000).

Jemal, A., et al., "Cancer Statistics, 2009" CA Cancer J Clin 2009;59:225-249.

Teo, E.J. et al., "Multicolor Photoluminescence from Porous Silicon Using Focused, High-Energy Helium Ions," Adv. Mater. 18, NA (2006).

Stewart, M.P. et al., "Chemical and Biological Applications of Porous Silicon Technology," J.M. Chemical and Biological Applications of Porous Silicon Technology. Adv. Mater. 12, 859-869 (2000).

Mathew, F.P. & Alocilja, E.C., "Porous silicon-based biosensor for pathogen detection," Biosens. Bioelectron. 20, 1656-1661 (2005).

Tsakalakos, L. et al., "Silicon nanowire solar cells," Appl. Phys. Lett. 91, 233117-3 (2007).

Chan, C.K. et al., "High-performance lithium battery anodes using silicon nanowires," Nature Nanotechnol. 3, 31-35 (2008).

Cui, Y. et al, "High Performance Silicon Nanowire Field Effect Transistors," Nano Letters 3, 149-152 (2003).

Hu, J. et al, "Controlled growth and electrical properties of heterojunctions of carbon nanotubes and silicon nanowires," Nature 399, 48-51 (1999).

Boukai, A.I. et al., "Silicon nanowires as efficient thermoelectric materials," Nature 451, 168-171 (2008).

McAlpine, M.C. et al., "High-Performance Nanowire Electronics and Photonics on Glass and Plastic Substrates," Nano Letters 3, 1531-1535 (2003).

Tian, B., et al., "Single-crystalline kinked semiconductor nanowire superstructures," Nature Nanotechnol advance online publication, doi:10.1038/nnano.2009.304 (2009).

Huang, Y. et al., "Nanowires for Integrated Multicolor Nanophotonics," Small 1, 142-147 (2005).

Byun, K., et al., "Functionalization of Silicon Nanowires with Actomyosin Motor Protein for Bioinspired Nanomechanical Applications," Small 5, 2659-2664 (2009).

Kim, W., "Interfacing Silicon Nanowires with Mammalian Cells," J. Am. Chem. Soc. 129, 7228-7229 (2007).

Chen, W. et al., "Silicon nanowires for high-sensitivity glucose detection," Appl. Phys. Lett. 88, 213104-3 (2006).

Zheng, G. et al., "Multiplexed electrical detection of cancer markers with nanowire sensor arrays," Nature Biotechnol. 23, 1294-1302 (2005).

Li, Z. et al., "Sequence-Specific Label-Free DNA Sensors Based on Silicon Nanowires," Nano Letters 4, 245-247 (2004).

Patolsky, F. et al., "Electrical detection of single viruses," Proc. Natl. Acad. Sci. USA 101, 14017-14022 (2004).

Li, X. & Bohn, P.W. "Metal-assisted chemical etching in HF/H2O2 produces porous silicon," Appl. Phys. Lett. 77, 2572-2574 (2000).

Peng, K. et al. "Uniform, Axial-Orientation Alignment of One-Dimensional Single-Crystal Silicon Nanostructure Arrays," Angew. Chem. Int. Ed. 44, 2737-2742 (2005).

Hochbaum, A.I. et al, "Single Crystalline Mesoporous Silicon Nanowires," Nano Letters 9, 3550-3554 (2009).

Qu, Y. et al., "Electrically Conductive and Optically Active Porous Silicon Nanowires," Nano Letters, advance online publication, doi: 10.1021/n1903030.

Credo, G.M., et al., "External quantum efficiency of single porous silicon nanoparticles," Appl. Phys. Lett. 74, 1978-1980 (1999).

Peng, K. et al., "Ordered silicon nanowire arrays via nanosphere lithography and metal induced etching," Appl. Phys. Lett 90, 163123-3 (2007).

Bettinger, C.J. & Bao, Z., "Organic Thin-Film Transistors Fabricated on Resorbable Biomaterial Substrates," Adv. Mater. 9999, NA (2009).

Zhang, M., et al., "Preparation of Large-Area Uniform Silicon Nanowires Arrays through Metal-Assisted Chemical Etching," J. Phys. Chem. C 2008, 112, 4444-4450.

Rowlands, S.E., et al., "Supercapacitor devices using porous silicon electrodes." Ionics 5, 144-149 (1999).

Vitanov, P. et al., "High-efficiency solar cell using a thin porous silicon layer," Thin Solid Films 297, 299-303 (1997).

Banholzer, Matthew J., et al., "On-wire lithography: synthesis, encoding and biological applications," Published online May 14, 2009; doi:10.1038/nprot.2009.52.

Chiappini, Ciro, et al., Biodegradable Porous Silicon Barcode Nanowires with Defined Geometry, Adv. Funct. Mater. 2010, 20, 2231-2239.

\* cited by examiner

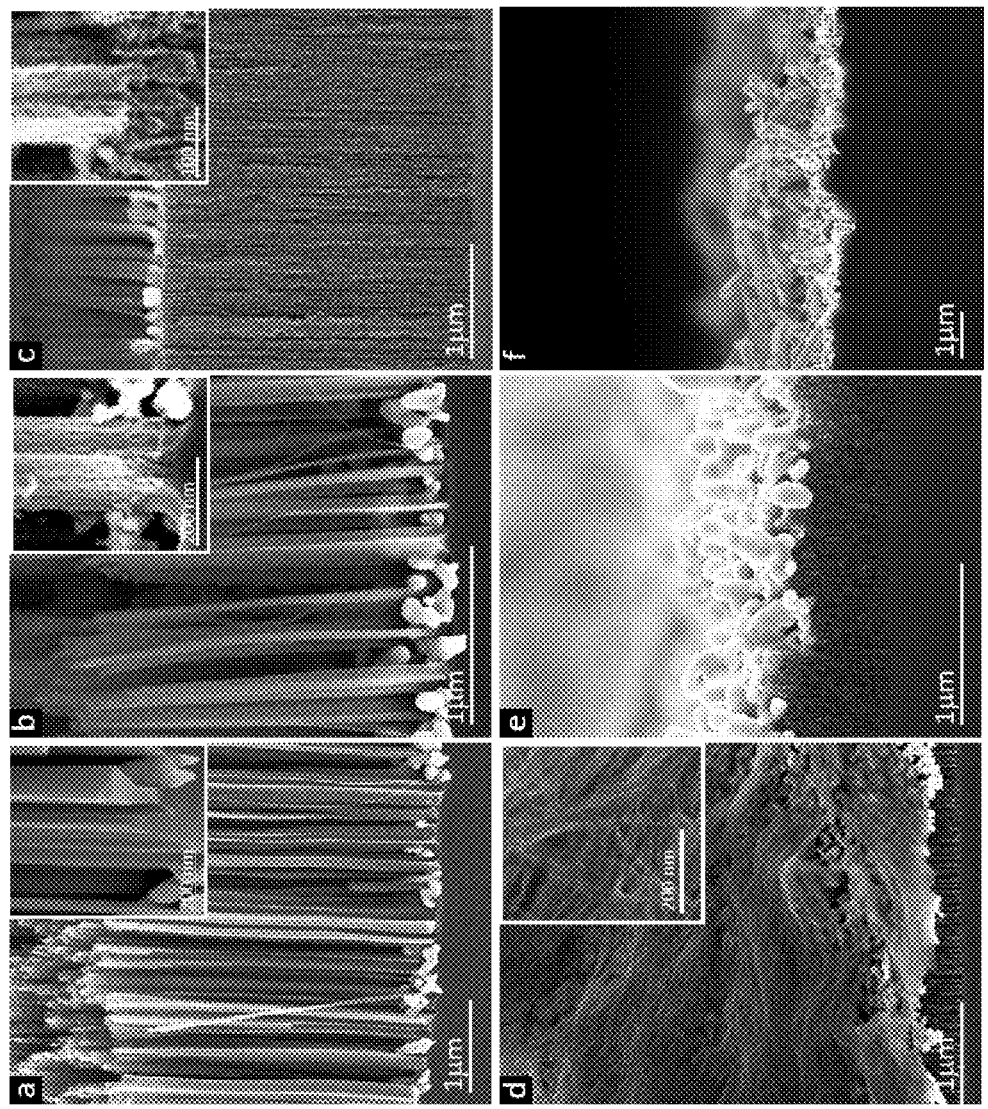
FIGURES 7 a-f

FIGURES 8 a-f
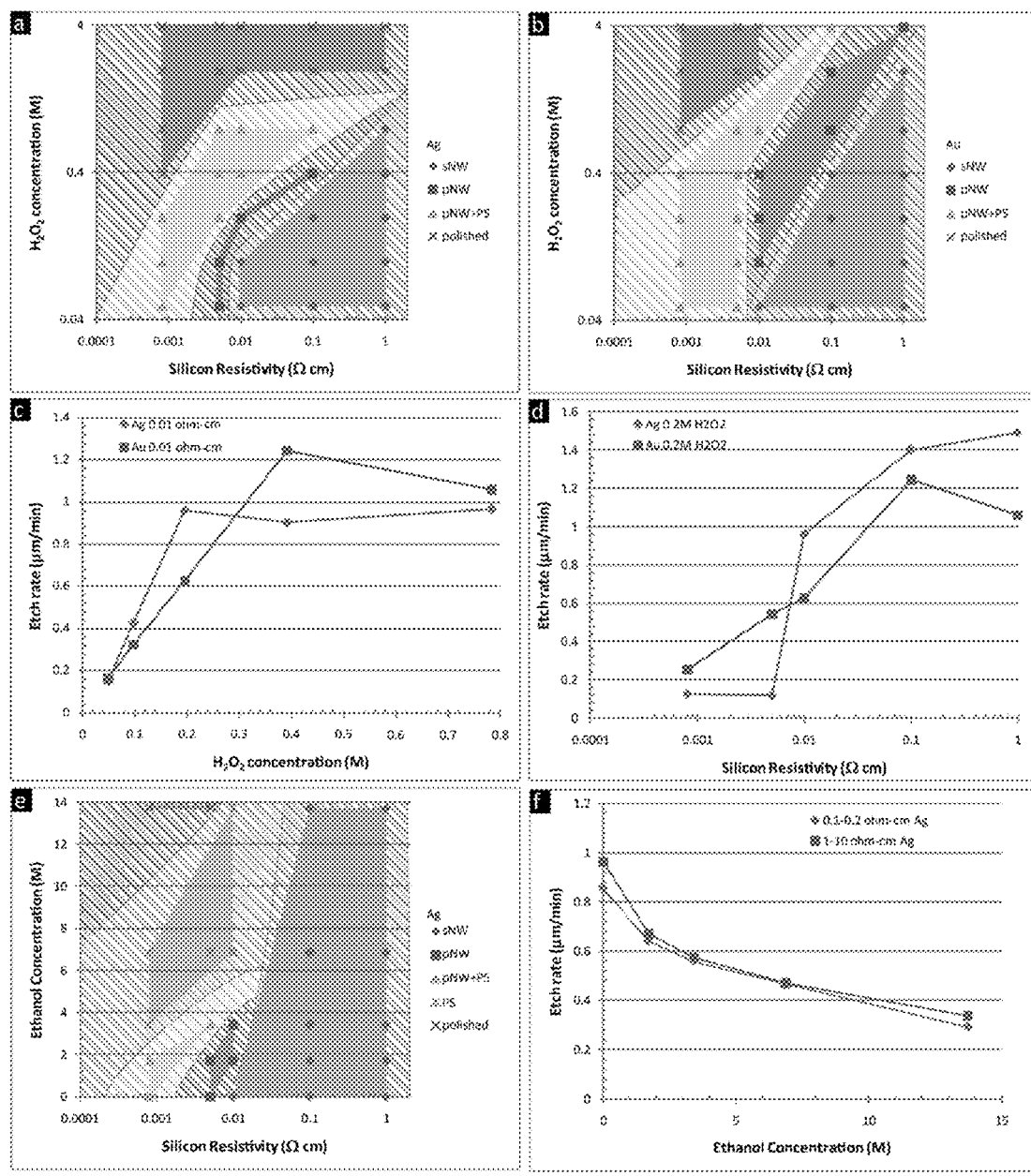

FIGURES 9 a-d
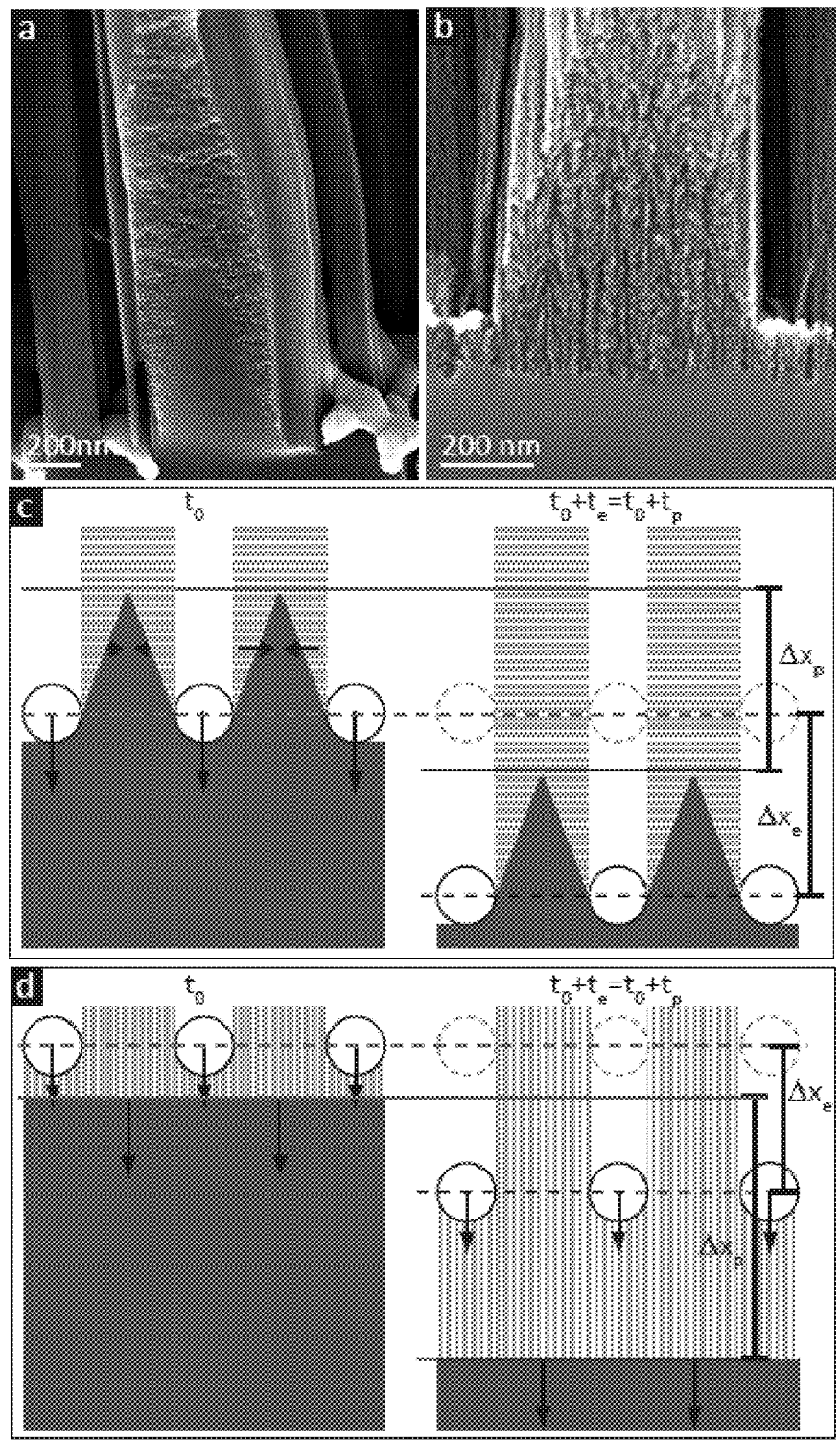

FIGURES 10 a-b
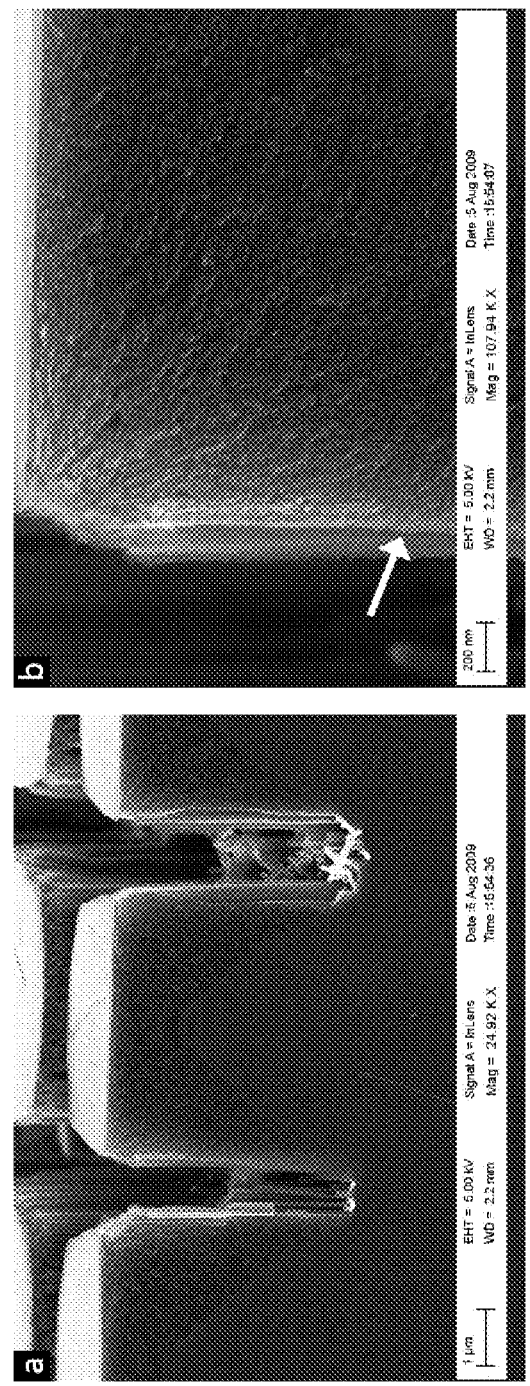

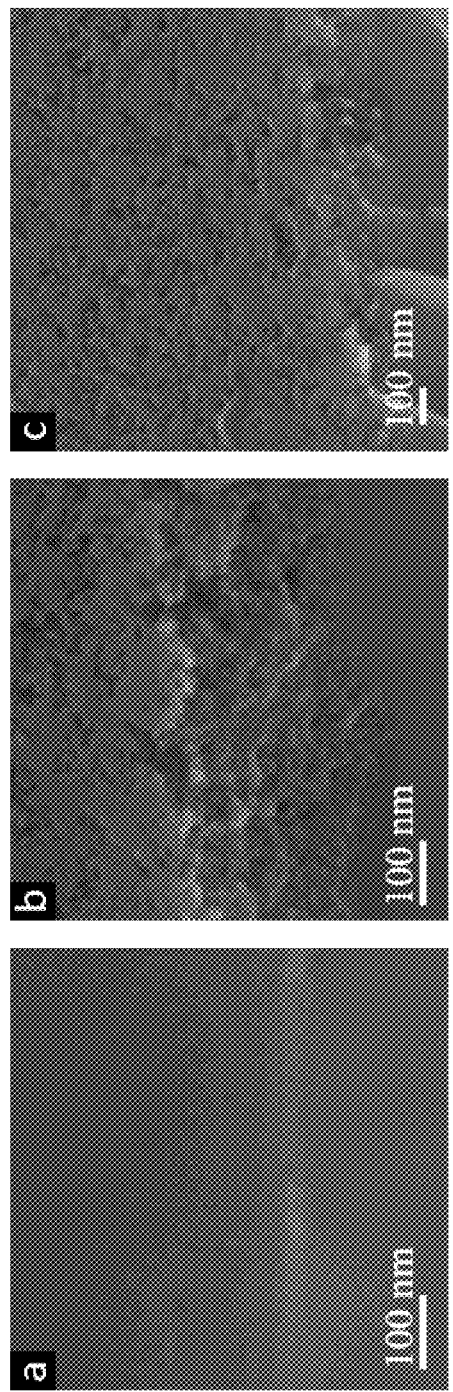
FIGURES 11 a-c

FIGURES 12 a-f
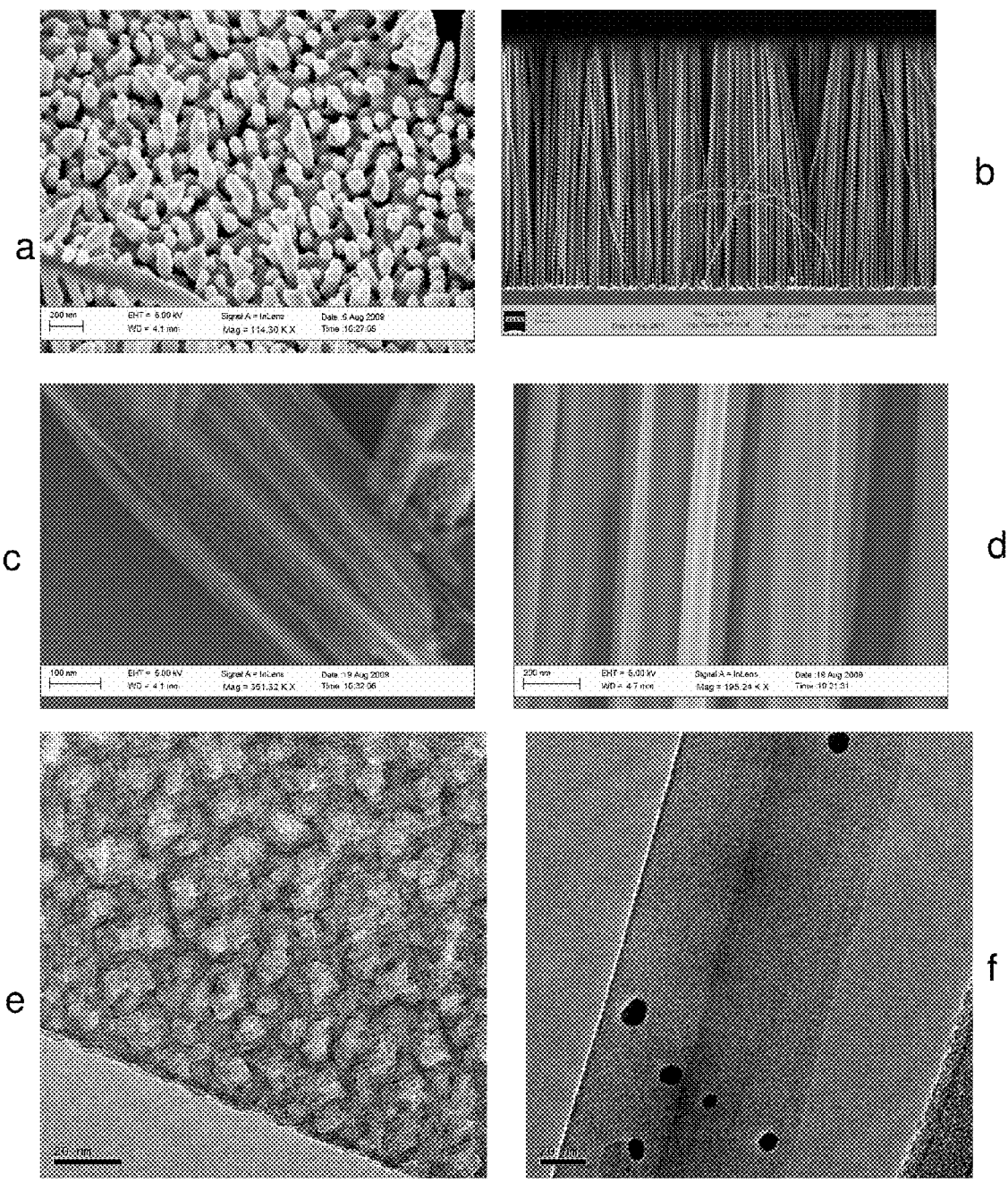

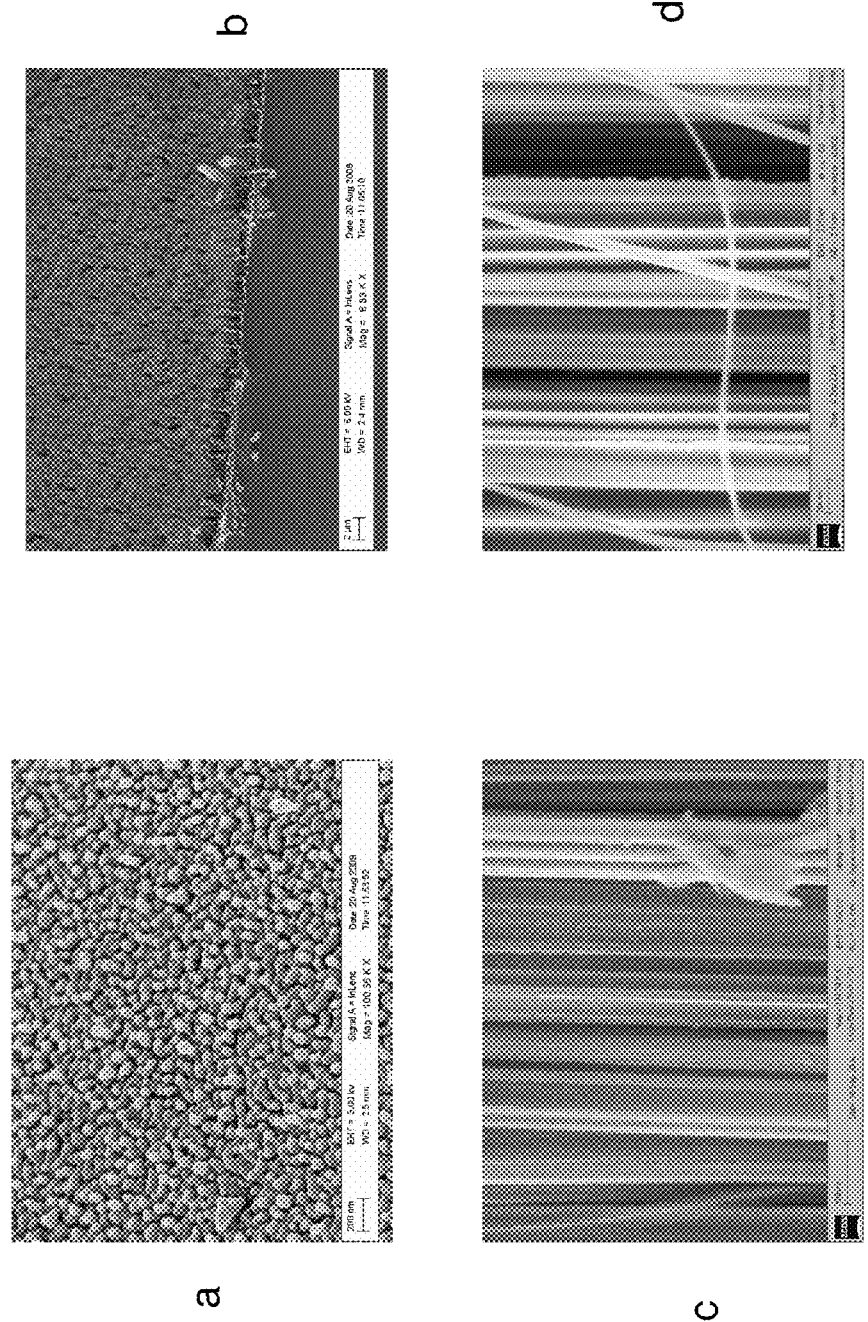
FIGURES 13 (a)-(d)

FIGURES 14 a-f
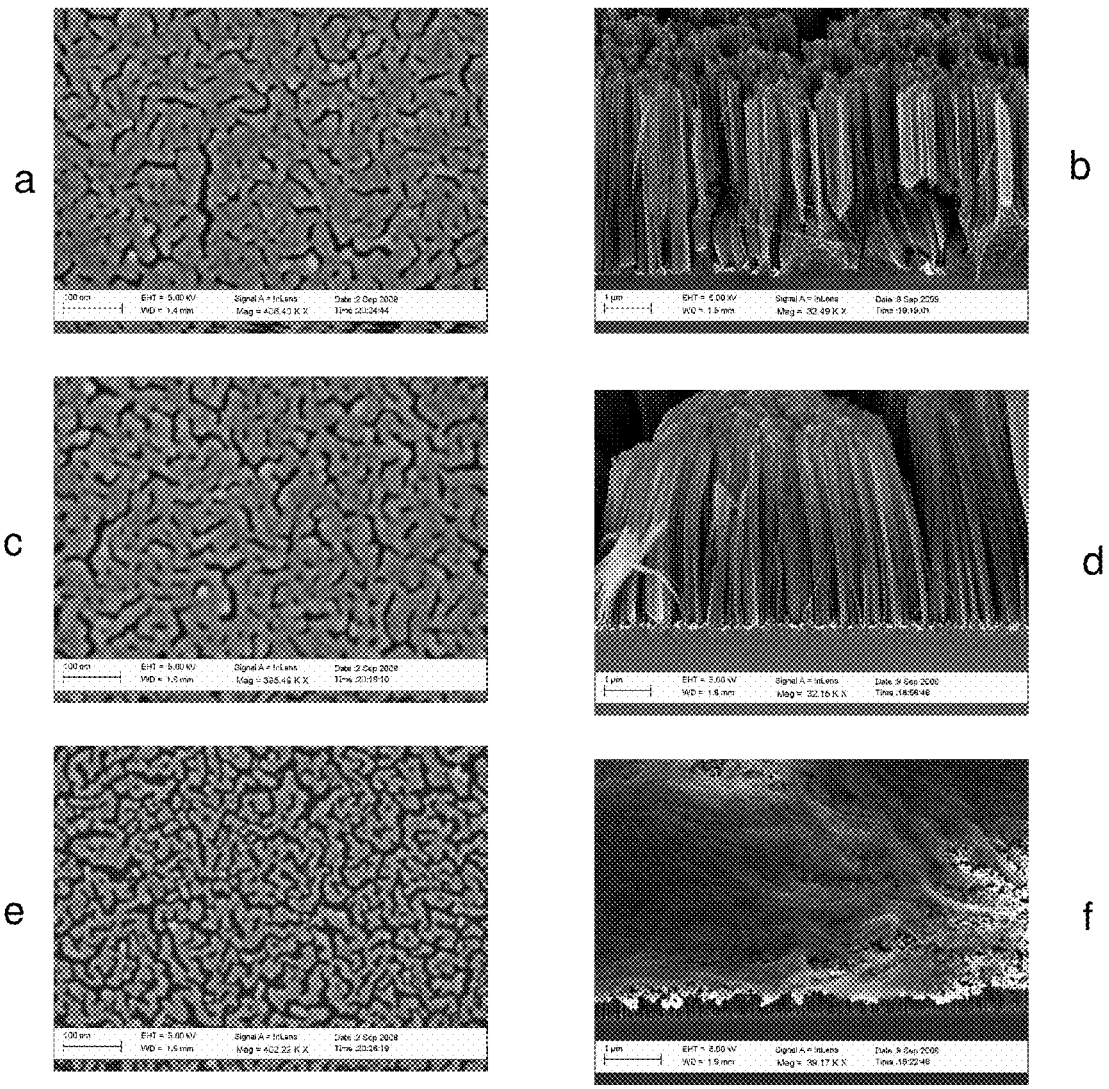

FIGURE 15 a-b
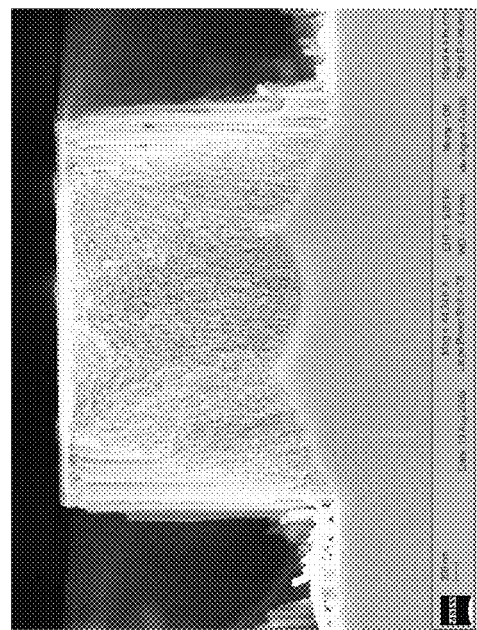
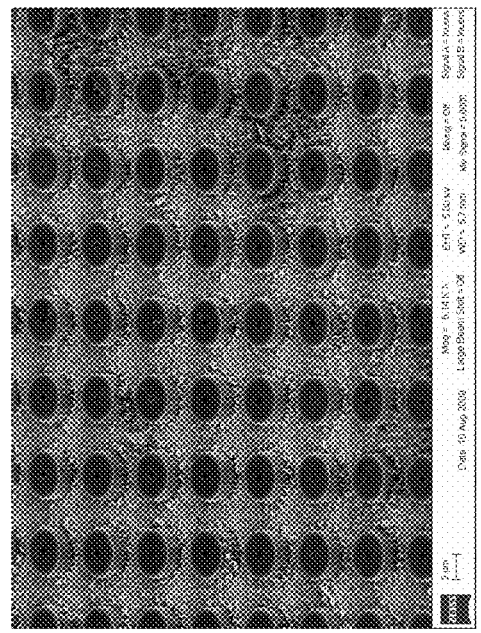

FIGURES 16 a-f
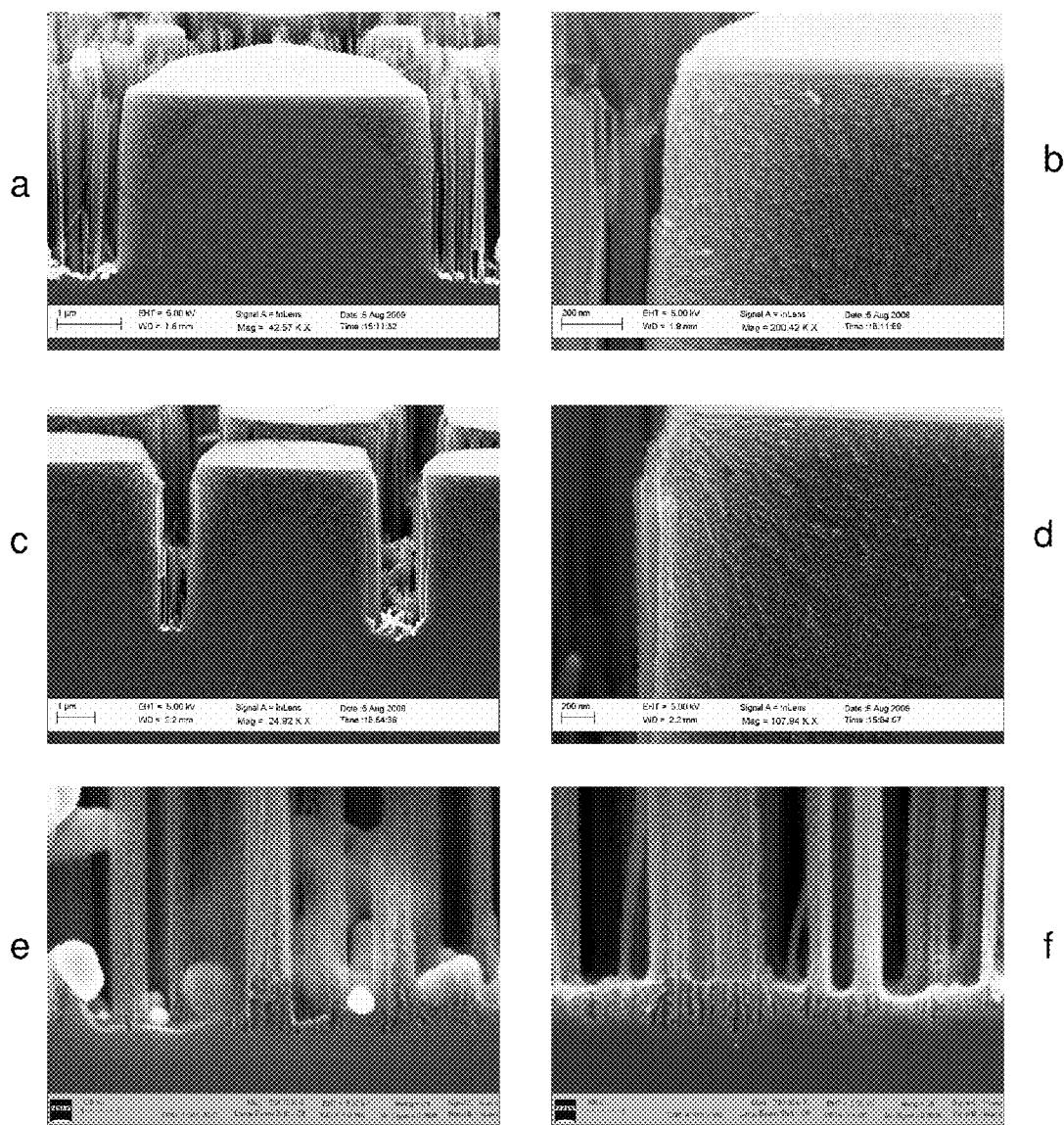

FIGURES 17 a-b
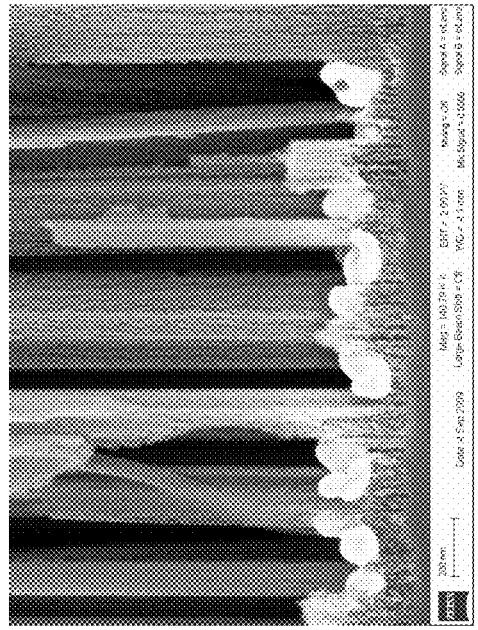
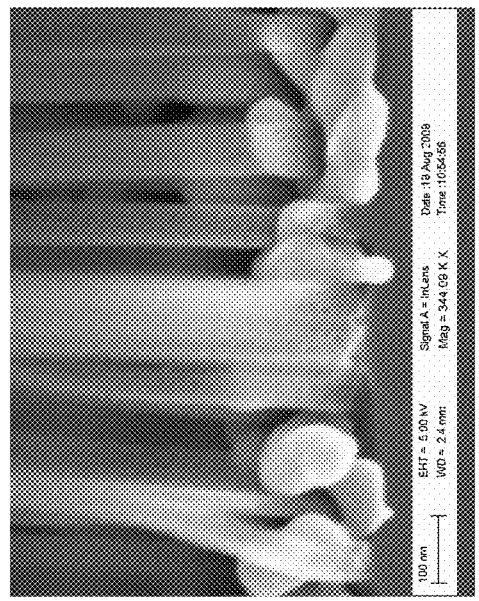

FIGURES 18 a-c
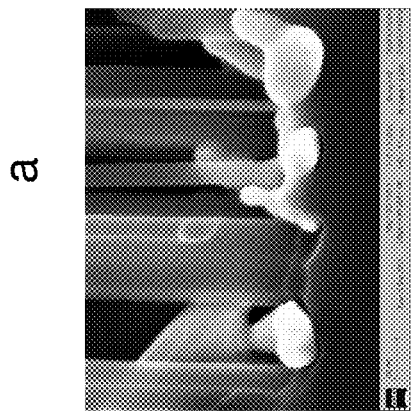
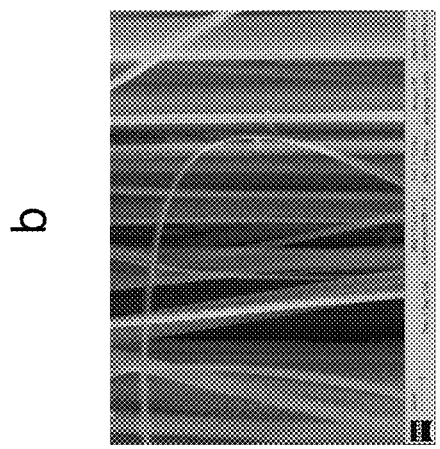
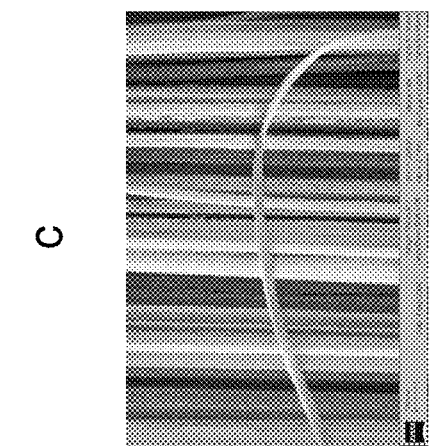

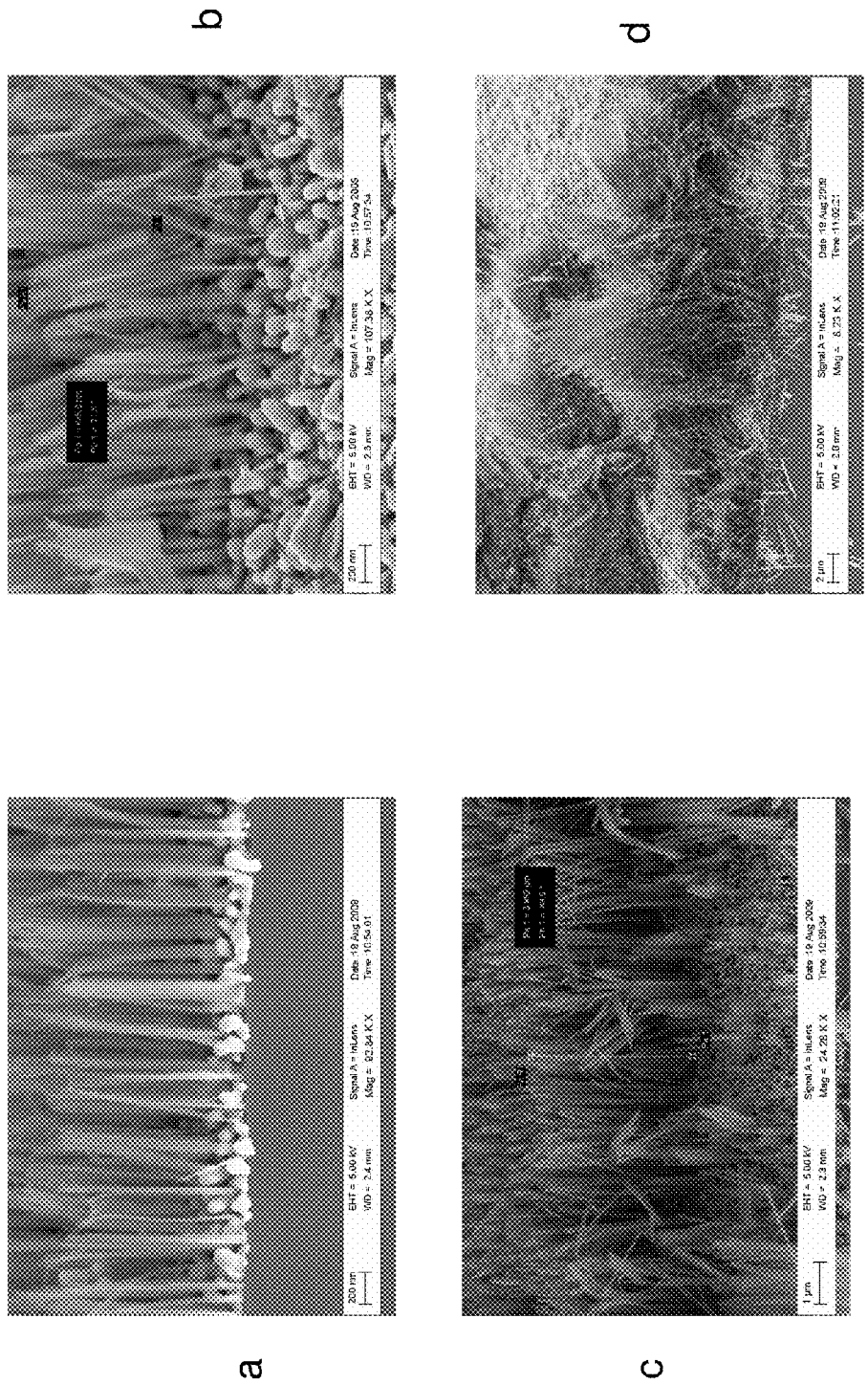
FIGURES 19 a-d

FIGURES 20 a-b
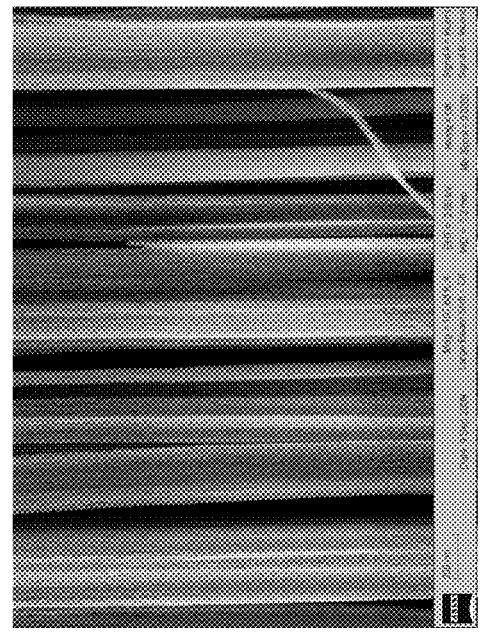
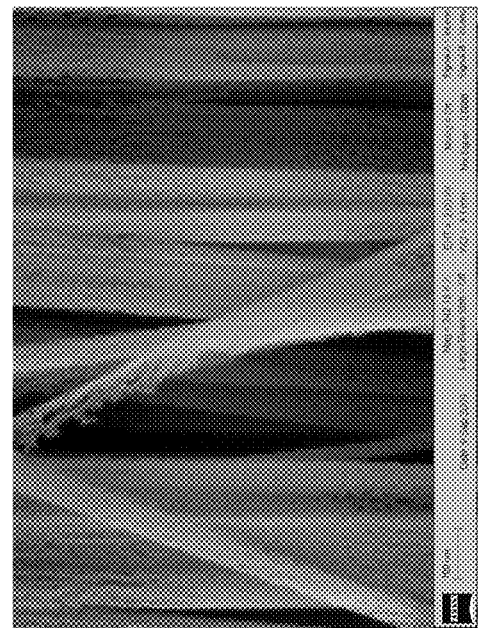

FIGURES 22 a-b
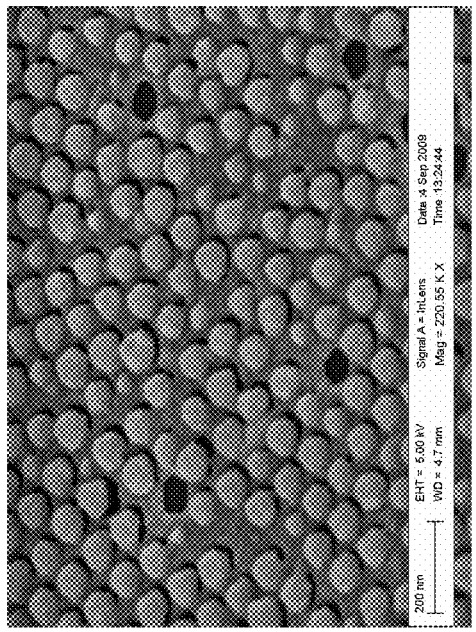
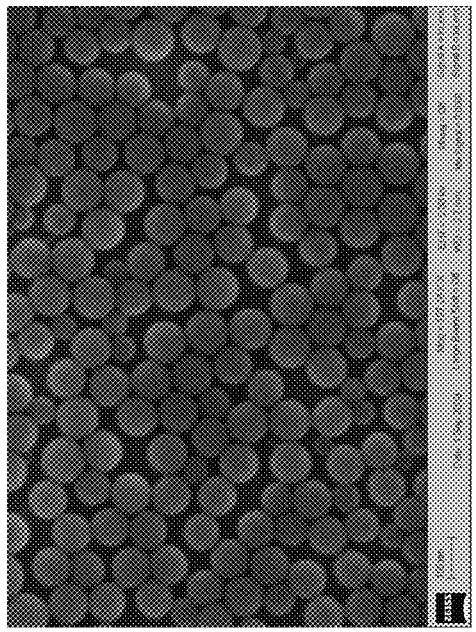

FIGURES 23 a-d
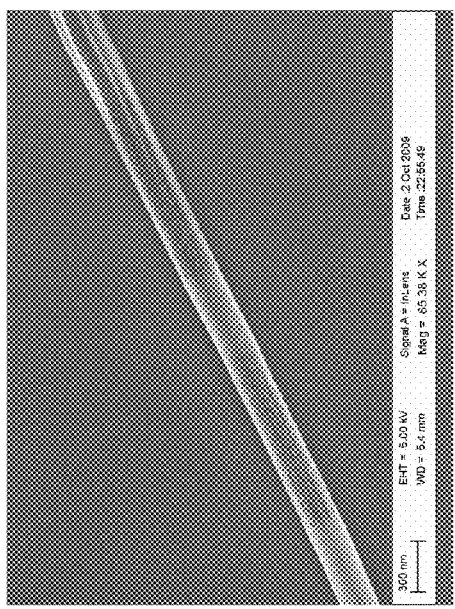
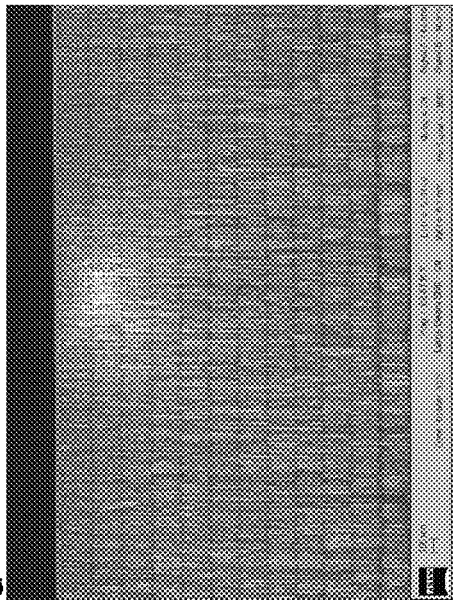
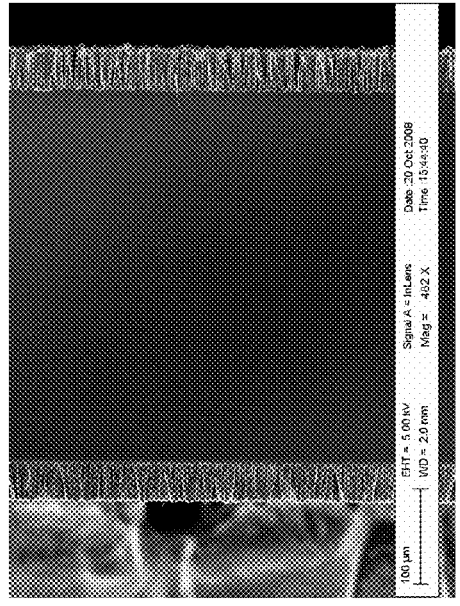
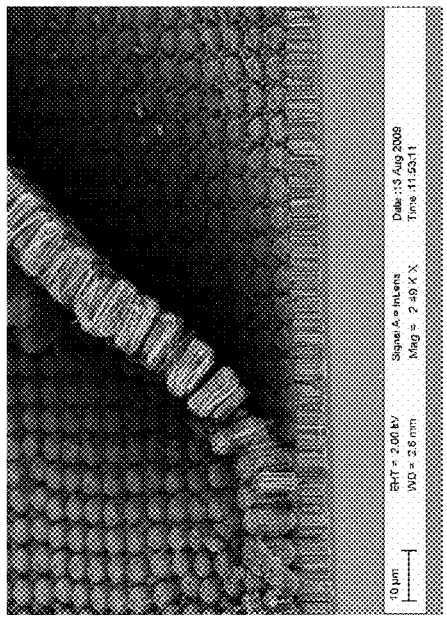

POROUS AND NON-POROUS NANOSTRUCTURES

CROSS REFERENCE TO RELATED APPLICATION

This application claims priority to U.S. Provisional Patent Application No. 61/282,627 filed on Mar. 9, 2010, the entirety of which is incorporated herein by reference.

STATEMENT REGARDING FEDERALLY SPONSORED RESEARCH

This invention was made with government support under Grant No. NNJO6HEO6A, awarded by the National Aeronautics and Space Administration; Grant Nos. CA128797 and CA122864, both awarded by the National Institutes of Health; Grant No. W911NF-09-1-0044, awarded by the Defense Advanced Research Projects Agency; and Grant Nos. W81XWH-07-2-0101 and W81XWH-09-1-0212, both awarded by the U.S. Department of Defense. The government has certain rights in the invention.

BACKGROUND OF THE INVENTION

Porous and non-porous nanostructures, such as silicon-based nanostructures, have many applications in many fields, including applications in electro-optical devices, sensors, solar cells, nanowires, and drug delivery. However, current nanostructures have numerous limitations relating to conductivity, resistance, porosity, and efficient fabrication methods. Therefore, there is currently a need to develop more effective nanostructures and methods of making them.

SUMMARY

In some embodiments, the present invention provides structures that comprise a porous object that comprises: (i) a first region; and (ii) a second region adjacent to the first region along an axis of the object, wherein the first region has at least one porous property different from that of the second region. Such properties include, without limitation, a pore size, porosity and pore orientation. The porous object also has a cross-section that is substantially perpendicular to the axis with at least one lateral dimension of no more than 5 microns. In addition, an aspect ratio of the object is no less than 4.

In other embodiments, the present invention provides structures comprising a porous object that comprises: (i) a high resistivity silicon; and (ii) a cross-section that is substantially perpendicular to an axis of the object. In addition, the cross-section has a lateral dimension of no more than 5 microns. Furthermore, the aspect ratio of the object is no less than 4.

In further embodiments, the present invention provides methods of making a porous object. Such methods generally comprise: (i) obtaining an etchable substrate; (ii) forming on a surface of the substrate a patterned porosification assisting metal layer that has at least one opening; and (iii) subsequently exposing the substrate to an etching solution. Thereafter, the etching solution dissolves the patterned porosification assisting layer to form a metal containing etching solution. The metal containing etching solution then porosifies a first portion of the substrate and etches out a second portion of the substrate to form a porous object having a cross-section determined by the opening.

In additional embodiments, the present invention provides additional methods of forming a porous object that comprise: (i) obtaining an etchable semiconductor substrate; (ii) depositing a porosification assisting metal on a surface of the substrate; and (iii) subsequently exposing the substrate to a first etching solution and a second etching solution to form respectively a first region and a second region of a porous object. The exposing results in dissolving the etch assisting metal in at least one of the first and second etching solutions to form a metal containing etching solution that porosifies a portion of the substrate. In the formed objects, the second region is adjacent to the first region along an axis of the wire and has at least one porous property different from that of the first region. Such properties include, without limitation, pore size, porosity and pore orientation.

Further embodiments of the present invention provide methods of making a porous object that comprise: (i) obtaining a silicon substrate having a resistance higher than 0.02 $\Omega \cdot cm$; (ii) depositing a porosification assisting metal on a surface of the substrate; and (iii) subsequently exposing the substrate to an etching solution that comprises an effective concentration of HF and an oxidant to form a porous object.

In other embodiments, the present invention provides additional methods of making a porous object that comprise: (i) obtaining a non-porous object that has a cross-section that is substantially perpendicular to an axis of the object, where the cross-section of the object has at least one lateral dimension of no more than 5 microns, and where the object has an aspect ratio of at least 4; and (ii) forming a porous object from the non-porous object by an electroless route that includes the exposure of the non-porous object to a porosifying solution comprising an effective concentration of HF, an oxidizer and at least one of ions and atoms of a porosification assisting metal.

Another embodiment of the present invention is a structure that comprises a porous object having an axis and a cross-section that is substantially perpendicular to the axis. In these embodiments, a lateral dimension of the cross-section does not exceed 1 micron. In addition, the aspect ratio of the object is no less than 2.

A person of ordinary skill in the art will recognize that the porous structures and methods of the present invention can have numerous applications. For instance, the methods of the present invention can be utilized to fabricate nanowires, such as multi-layered silicon-based nanowires. Likewise, the structures of the present invention can have numerous applications, including applications as drug delivery vectors, drug delivery nanoneedles, bar-coded wires, and imaging agents.

BRIEF DESCRIPTION OF THE FIGURES

In order that the manner in which the above recited and other advantages and objects of the invention are obtained, a more particular description of the invention briefly described above will be rendered by reference to specific embodiments thereof, which are illustrated in the appended Figures. Understanding that these Figures depict only typical embodiments of the invention and are therefore not to be considered limiting of its scope, the invention will be described with additional specificity and detail through the use of the accompanying Figures in which:

FIG. 1(a) shows scanning electron micrographs of <0.005 $\Omega$-cm porous silicon nanochains (i.e., barcode nanowires, silicon nanowires or SiNWs) obtained by Ag assisted etch (0.05M $H_2O_2$ for 5 min followed by 0.2M $H_2O_2$ for 1 min, repeated three times). Left: lateral overview as synthesized nanochains showing the alternation of high porosity and low porosity chain links. Right: Close up view of the high-low porosity transition of a single nanochain (Scale bar is 100 nm).

FIG. 1(b) shows confocal microscopy images of porous SiNWs; from top to bottom: Bright field image of a <0.005 Ω-cm 0.1M $H_2O_2$ porous SiNW; fluorescence image of the same nanowire at 500 nm; Fluorescence image at 500 nm wavelength of a <0.005 Ω-cm 0.05M/0.2M $H_2O_2$ porous silicon nanochain; bright field image of the same nanochain.

FIG. 1(c) shows photoluminescence spectra of porous SiNW in isopropyl alcohol. The photoluminescence spectrum corresponding to the 0.05M/0.2M $H_2O_2$ nanochain agrees well with the spectrum resulting from the superposition of the 0.05M $H_2O_2$ and the 0.2M $H_2O_2$ spectra. Initial sample concentration is unknown. Thus spectra have been scaled (90% of original 0.05M $H_2O_2$, 50% of original 0.2M $H_2O_2$) to minimize the absolute value residuals between the nanochain and the superposition spectra. Polystyrene beads have been employed as negative control and used to subtract background.

FIG. 1(d) shows a reflection microscopy image of a 0.05M/0.2M $H_2O_2$ nanochain showing the different colors associated with each chain link.

FIG. 1(e) shows confocal microscopy images of a 0.05M/0.2M $H_2O_2$ nanochain loaded with Q-dots at 458 nm excitation. From top to bottom: Fluorescent signal at 560 nm, Fluorescent signal at 633 nm, bright field signal, superposition.

FIG. 1(f) shows photoluminescence spectrum of a 0.05M/0.2M $H_2O_2$ nanochain loaded with Q-dots showing Q-dots associated peaks at 560 nm and 633 nm.

FIG. 4(a) is a 400 nm×2000 nm, 600 nm pitch photolithographic pattern.

FIG. 4(b) is a 600 nm diameter, 1400 nm pitch photolithographic pattern.

FIG. 4(c) is a 20 nm thick electron-beam evaporated Ag film on silicon deposited through a 130 nm diameter, 30 nm pitch stencil mask.

FIG. 4(d) is a 130 nm diameter porous silicon nanopillars obtained by metal assisted etch of the pattern shown in (c) in 0.05M $H_2O_2$ for 20 min.

FIG. 5(a) shows scanning electron micrograph of a <0.005 Ω-cm multicolor nanopillar etched for 20 min in 0.05M $H_2O_2$.

FIG. 5(b) shows magnification of the pillar in (a) showing the transition between low and high porosity chain link.

FIGS. 7(a)-(f) present cross sectional scanning electron micrographs of the different silicon nanostructure morphologies obtained by metal assisted etch in a study of silicon nanostructure morphology as a function of the etch parameters. The inset is a magnification of the sample shown in the cross section focusing on the structure of a single nanowire.

FIG. 7(a) shows solid silicon nanowires: 1-10 Ω-cm, Ag, 0.1M $H_2O_2$, 15 min.

FIG. 7(b) shows porous silicon nanowires: <0.005 Ω-cm, Ag, 0.1M $H_2O_2$, 15 min.

FIG. 7(c) shows thick porous silicon nanowires on top of porous silicon layer: <0.005 Ω-cm, Ag, 0.1M $H_2O_2$, 3.5M ethanol, 5 min.

FIG. 7(d) shows thin, spaghetti-like porous silicon nanowires on top of porous silicon layer: 0.0008-0.001 Ω-cm, Au, 0.1M $H_2O_2$, 15 min.

FIG. 7(e) shows porous silicon layer: 0.01-0.02 Ω-cm, Ag, 0.1M $H_2O_2$, 6.8M ethanol, 5 min.

FIG. 7(f) shows polished silicon surface: 0.1-0.2 Ω-cm, Ag, 0.78M $H_2O_2$, 5 min.

FIGS. 8 (a)-(f) present results of a study of formation of nanostructures as a function of etching parameters.

FIG. 8(a) shows phase diagram of the different silicon nanostructure morphologies obtained by Ag assisted etch as a function of resistivity of the substrate and concentration of $H_2O_2$.

FIG. 8(b) shows phase diagram of the different silicon nanostructure morphologies obtained by Au assisted etch as a function of resistivity of the substrate and concentration of $H_2O_2$.

FIG. 8(c) shows Si nanowire etch rate as a function of $H_2O_2$ concentration. Red squares indicate Au assisted etch of 0.01-0.02 Ω-cm substrates in 2.9M HF, 0M ethanol. Blue circles indicate Ag assisted etch of 0.01-0.02 Ω-cm substrates in 2.9M HF, 0 M ethanol.

FIG. 8(d) shows Si nanowire etch rate as a function of substrate resistivity. Red squares indicate Au assisted etch in 0.2M $H_2O_2$, 2.9M HF, 0M ethanol. Blue circles indicate Ag assisted etch in 0.2M $H_2O_2$, 2.9M HF, 0M ethanol.

FIG. 8(e) shows phase diagram of the different silicon nanostructure morphologies obtained by Ag assisted etch as a function of resistivity of the substrate and concentration of ethanol.

FIG. 8(f) shows Si nanowires etch rate as a function of ethanol concentration. Red squares indicate Au assisted etch of 1-10 Ω-cm substrates in 0.1M $H_2O_2$, 2.9M HF. Blue circles indicate Ag assisted etch of 0.1-0.2 Ω-cm substrates in 0.1M $H_2O_2$, 2.9M HF.

FIGS. 9 (a)-(d) relate to a study of porous nanowires and porous nanowires on porous silicon film. The difference in pore structure between porous nanowires and porous nanowires on porous silicon film may be a result of a different etch mechanism.

FIG. 9(a) shows a cross sectional scanning electron micrograph of the base of porous silicon nanowire: <0.005 Ω-cm, Ag, 0.1M $H_2O_2$, 60 min. Porosification occurs after the nanowire wall is formed, the porous structure is from the nanowire wall towards its major axis and does not fully extend to the base.

FIG. 9(b) shows a porous silicon nanowire on porous silicon layer: <005 Ω-cm, Au, 0.4M $H_2O_2$, 15 min. The porous structure is parallel to the nanowire wall and extends as continuous pores into the porous silicon film beneath. The silicon is first porosified and the nanowires walls are etched in the porous layer. The metal nanoparticles are localized at the top of the porous silicon film indicating that they do not catalyze porosification.

FIG. 9(c) is a schematic depiction of a possible and non-limiting etch mechanism for the conditions depicted in FIG. 9(a). Without being bound by theory, the metal nanoparticles in this depiction may etch into the solid silicon while the ions may form pores orthogonal to the surface exposed to the electrolyte. During the elapsed time $\Delta t$, the porosification front may move a distance $\Delta x_p$, and the nanowire etch front may move a distance $\Delta x_e$.

FIG. 9(d) is a schematic depiction of a possible and non-limiting etch mechanism for the conditions depicted in FIG. 9(b). Without being bound by theory, the metal nanoparticles may etch the nanowires into the porous silicon layer formed by the ions.

FIGS. 10 (a)-(b) present data demonstrating that pore formation is orthogonal to the surface exposed to the electrolyte.

FIG. 10(a) shows SEM micrograph of a fresh cleave through the diameter of a 5 um silicon pillar structure showing pores formed during metal assisted electroless etch.

FIG. 10(b) shows a close-up view of the pillar showing pores radiating from the top edge due to the porosification occurring during the initial phase of the etch when the nanoparticle is still anchored to the original Si surface. Arrow indicates the transition point where the nanoparticle surpasses the porous structure. The 5 um pillar structure was obtained by first depositing a 90 nm layer of $Si_3N_4$ on the surface of a <0.005 Ω-cm p-type Si wafer, followed by photolithography and pattern transfer by $CF_4$ gas RIE to expose the underlying silicon field. Ag nanoparticles were selectively deposited on the Si from a solution of 2.9M HF and 0.02M $AgNO_3$ in the dark for 30 s. The porous pillars were formed by electroless metal etch in 0.1M $H_2O_2$, 2.9M HF for 15 minutes. The substrates were rinsed, cleaved and analyzed by SEM.

FIGS. 11(a)-(c) demonstrate that porosification is catalyzed by metal ions.

FIG. 11(a) shows a SEM of a fresh cleave of a <0.005 Ω-cm bare silicon substrate following a 30 minute immersion in 0.1M $H_2O_2$, 2.9M HF.

FIG. 11(b) shows an SEM of the above-mentioned silicon substrate following a 10 minute immersion in the 0.1M $H_2O_2$, 2.9M HF solution. A metal deposited silicon substrate with a resistance of <0.005 Ω-cm was etched immediately prior to the immersion.

FIG. 11(c) shows an SEM of the above-mentioned silicon substrate following a 10 minute immersion in the 0.1M $H_2O_2$, 2.9M HF solution. A metal deposited silicon substrate with a resistance of <0.005 Ω-cm was being etched at the same time as this immersion. Only samples in (b) and (c) show porosification. In addition, no metal nanoparticles are present on the surface or within the porous structure.

FIGS. 12 (a)-(f) present as follows:

FIG. 12(a) shows an SEM image of silver deposited on silicon wafer.

FIG. 12(b) shows an SEM image of produced silicon nanowires.

FIG. 12(c) shows an SEM image displaying the porous structure of porous silicon nanowires.

FIG. 12(d) shows an SEM image of nonporous silicon nanowires.

FIG. 12 (e) shows a TEM image of porous silicon nanowires.

FIG. 12(f) shows a TEM image of nonporous silicon nanowires.

FIGS. 13 (a)-(d) present SEM images of the following:

FIG. 13(a) shows an SEM image of silver deposited on N-type silicon wafer.

FIG. 13(b) shows an SEM image of produced silicon nanowires.

FIG. 13(c) shows an SEM image displaying the porous structure of porous silicon nanowires.

FIG. 13(d) shows an SEM image of nonporous silicon nanowires.

FIGS. 14 (a)-(f) present SEM images of gold assisted etch of porous silicon nanowires.

FIG. 14(a) shows an SEM image of Au deposited by galvanic substitution on 0.02 ohm-cm p-type silicon.

FIG. 14(b) shows an SEM image of porous silicon nanowires obtained by electroless etch of the sample shown in FIG. 14(a).

FIG. 14(c) shows an SEM image of Au deposited by galvanic substitution on <0.005 Ω-cm p-type silicon.

FIG. 14(d) shows an SEM image of porous silicon nanowires obtained by electroless etch of the sample shown in FIG. 14(c).

FIG. 14(e) shows an SEM image of Au deposited by galvanic substitution on <0.0008 Ω-cm p-type silicon.

FIG. 14(f) shows an SEM image of porous silicon nanowires obtained by electroless etch of the sample shown in FIG. 14(e).

FIGS. 15 (a)-(b) are SEM images of: (a) an array of porous silicon rods; and (b) a cross-section of a porous silicon rod showing its nanoporous structure.

FIGS. 16 (a)-(f) are SEM images of: (a) a patterned array after a 2 minute etch; (b) a zoom-in of FIG. 16(a); (c) a patterned array after a 5 minute etch; (d) a zoom-in of FIG. 15(c); (e) a bottom of a porous structure showing Ag particles; and (f) a bottom of the porous structure in FIG. 1(e) after removing the Ag particles.

FIGS. 17 (a)-(b) are SEM images of porous nanowires etched in (a) 0.3% $H_2O_2$ solution; and (b) 0.6% $H_2O_2$ solution.

FIGS. 18 (a)-(c) are SEM images of silicon nanowires etched in 0.6% $H_2O_2$: (a) 1-10 Ω-cm, nonporous; (b) 0.01-0.02 Ω-cm, porous; and (c) 0.005 Ω-cm, higher porosity.

FIGS. 19 (a)-(d) are SEM images of silicon nanowires etched under the following conditions: (a) 5% HF; (b) 10% HF; (c) 15% HF; and (d) 20% HF.

FIGS. 20 (a)-(b) are SEM images of porous silicon nanowires etched under the following conditions: (a) etched alternatively in 0.15%, 0.6%, and 0.15% $H_2O_2$; and (b) etched alternatively in 0.3%, 0.6% and 0.3% $H_2O_2$.

Figure 1:
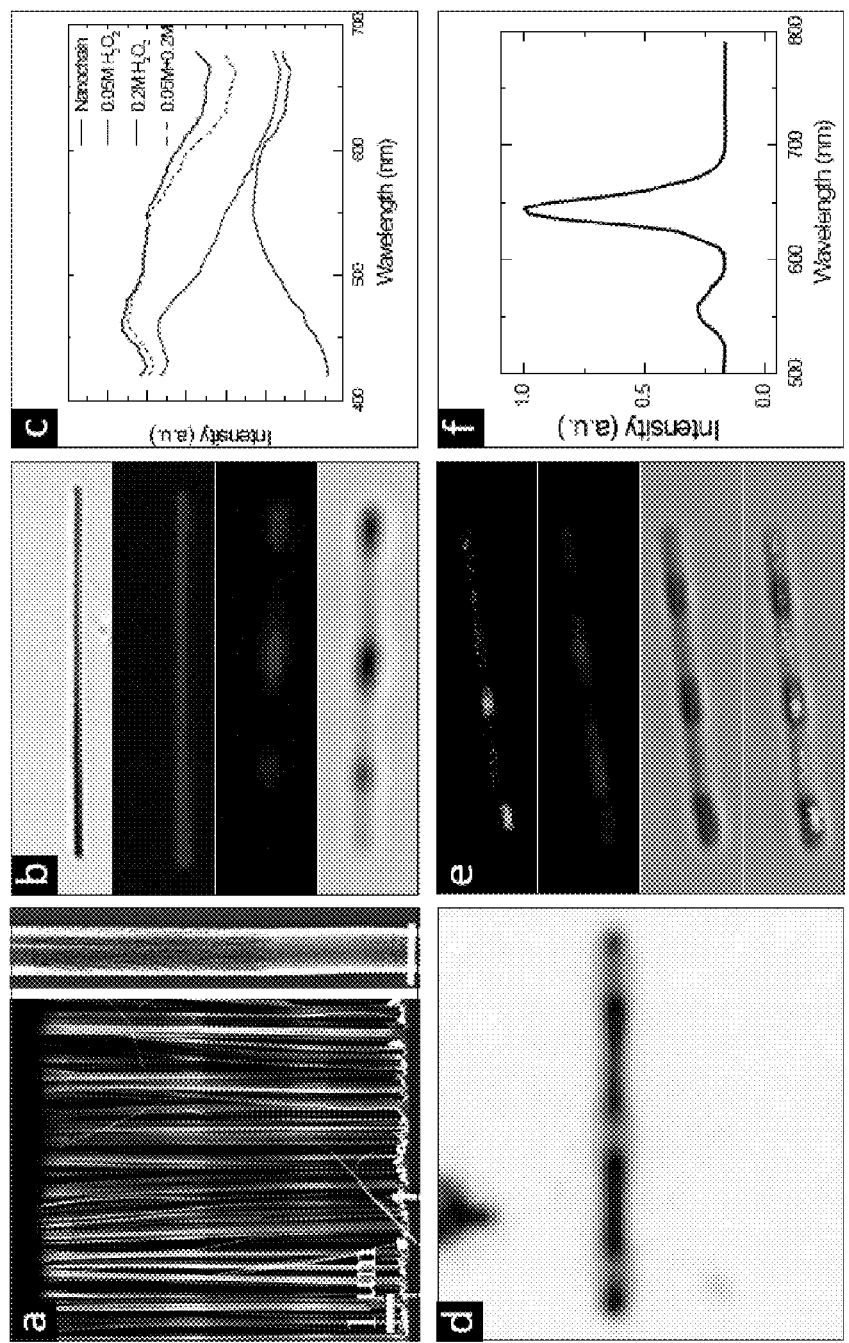
FIGS. 1(a)-(f) relate to exemplary multicolor porous silicon barcode-type nanowires and nanochains.

Left column refers to 0.02 Ω-cm porous silicon nanowires in PBS, where the storage time period from top to bottom was 0 h, 8 h, 16 h, 24 h, 48 h, and 72 h, respectively.

Middle column refers to 0.005 Ω-cm solid silicon nanowires in PBS, where the storage time period from top to bottom was 0 h, 8 h, 16 h, and 24 h, respectively.

Right column refers to 0.005 Ω-cm porous silicon nanowires treaded with oxygen plasma, where the PBS storage time from top to bottom was 0 h, 8 h, 16 h, 24 h, 48 h, and 72 h, respectively.

FIGS. 22 (a)-(b) are SEM images of: (a) spin-coated 100 nm latex beads; and (b) the spin-coated latex beads in FIG. 22(a) after $O_2$ plasma treatment and silver deposition.

FIGS. 23 (a)-(e) show SEM images that illustrate various aspects of silicon-based porous structures, in accordance with some embodiments of the present invention.

FIG. 23(a) shows an example of a 40 μm long silicon nanowire etched on both sides of a silicon wafer.

FIG. 23(b) shows a multi-segment nanowire with high porosity segments that are structurally weaker. Such segments can be used as breaking points.

FIG. 23(c) illustrates a breaking down of a multi-segment structure.

FIG. 23(d) shows a porous silicon film that has been patterned and metal-etched to a stack of particles.

DETAILED DESCRIPTION

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

The section headings used herein are for organizational purposes only and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

The present inventors developed porous and non-porous structures and methods of making and using such structures. The structures can have a cross-section and an axis, which can be perpendicular or substantially perpendicular to the cross-section. The term "substantially perpendicular" can mean that an angle between a plane of the cross-section and the axis of the structure deviates no more than 20 degrees, no more than 15 degrees, no more than 10 degrees, or no more than 5 degrees from 90 degrees.

The structures may be characterized by a length, which is a dimension of the structure along the axis. The structures can also be characterized by lateral dimension(s) of the cross-section. For example, when a cross-section is circular in shape, a single lateral dimension of such a cross-section can be its diameter. Similarly, when a cross-section is square in shape, a single lateral dimension of such a cross-section can be a length its of side. Likewise, when a cross-section is rectangular in shape, its two lateral dimensions can be lengths of its sides.

In many embodiments, the greater of lateral dimension(s) of the cross-section of the structure is no more than 10 microns, no more than 5 microns, no more than 2 microns, no more than 1 micron, no more than 500 nm, no more than 200 nm, no more than 100 nm, or no more than 50 nm. In many embodiments, the smaller of the lateral dimension(s) of the structure's cross-section is no more than 5 microns, no more than 2 microns, no more than 1 micron, no more than 500 nm, no more than 200 nm, no more 100 nm, or no more than 50 nm.

The structure may have a variety of cross-section shapes. In some embodiments, the cross-section may be round or circular. In some embodiments, the cross-section may be rectangular.

In many embodiments, the structure may be an elongated structure, which has an aspect ratio of at least 2, at least 4, at least 10, at least 20, at least 50, at least 100, at least 200, at least 500, or at least 1000. An aspect ratio of the structure may be defined as a ratio between the length of the structure and its lateral dimensions for structures that have a cross-section characterized by a single lateral dimension, such as a circular cross-section or a square cross-section, or as a ratio between the length of the structure and a square root of a product of two lateral dimensions for structures that have a cross-section characterized by two dimensions, such as a rectangular cross-section.

In some embodiments, the structure may be an elongated structure with a nanoscale cross-section (e.g., a cross-section with the larger of the cross-section's lateral dimensions no greater than 1 micron and no greater than 800 nm, or no greater than 500 nm). In some embodiments, the elongated structure also has an aspect ratio of at least 2, at least 4, at least 10, or at least 20.

In some embodiments, the elongated structure may be viewed as a wire or a wire-like structure, which may be a micro or nano wire structure depending on particular dimensions of the structure. The wire like structure has a cross-section, for which two mutually orthogonal lateral dimensions have substantially the same length, which means that a ratio between two mutually orthogonal lateral dimensions of the cross-section is no greater than 1.5. For example, for an elongated structure with a circular cross-section, both mutually orthogonal dimensions have a length of the cross-section's diameter. Thus, such an elongated structure may be viewed as a wire-like structure.

The elongated structures may have a wide range of flexibilities (flexural modulus). In general, and without being bound by theory, structures with higher porosity and smaller cross-sections will be more flexible. For example, for two elongated structures, which differ only in their porosities, but are otherwise identical, the structure, which has a higher porosity, will be more flexible than the otherwise identical structure, which has a lower porosity. For two elongated structures, which differ only in the cross-section's thickness, but are otherwise identical, the structure with a thinner cross-section thickness will be more flexible than the structure with a thicker cross-section thickness.

Yet, in some embodiments, the elongated structure may be viewed as a belt or ribbon-like structure, which may be a micro-belt, ribbon or nano-belt, depending on the size. The belt or ribbon-like structure has a cross-section, for which two mutually orthogonal lateral dimensions have substantially different lengths, which means that a ratio between two mutually orthogonal lateral dimensions of the cross-section is greater than 1.5. For example, an elongated structure with a rectangular cross-section, which has a ratio between its sides' lengths greater than 1.5, may be viewed as a belt or ribbon-like structure. In some embodiments, the belt or ribbon-like structure may have a ratio between two mutually orthogonal lateral dimensions of its cross-section greater than 2, greater than 3, greater than 5, or greater than 10.

In certain embodiments, the structure can be a porous structure (i.e. a structure that contains at least one porous region). In various embodiments, an average pore size in such porous region can be no more than 200 nm, no more than 100 nm, no more than 50 nm, no more than 25 nm, no more than 20 nm, no more than 15 nm, no more than 10 nm, from 1 nm to 200 nm, from 1 nm to 100 nm, from 1 nm to 50 nm, from 1 nm to 20 nm, or from 1 nm to 10 nm.

In some embodiments, a porosity of the porous region can be from 5% to 90%, from 10% to 90%, from 15% to 90%, from 20% to 90%, or any sub-range defined by integers within these ranges.

In some embodiments, pores can be oriented in the direction parallel to the axis of the structure. Yet, in some embodiments, pores may be oriented perpendicular to an axis of the structure.

In some embodiments, the structure or one or more of the structure's regions may be biodegradable. Without being bound by any theory or definition, biodegradability can mean that the structure can dissolve or degrade in a physiological medium, such as PBS, cell culture media, cell cytosol, or a body fluid such as plasma, serum, blood, interstitial fluid, and G.I. tract fluid. A biodegradation rate for biodegradable regions and structures may depend on a number of parameters, such as pore size and porosity. See, e.g., Canham, Biomedical Applications of Silicon, In Canham L T, editor, Properties of porous silicon. EMIS data review series No. 18. London: Pages 371-376.

The biodegradation rate may also depend on surface modification. For example, oxidation of the pore surface, which may be performed, for example, by oxygen plasma, may increase a biodegradation time. PCT Application No. PCT/US2009/000239 discloses methods of controlling biodegradation rates of porous structures, such as porous silicon structures, by depositing on porous surfaces polymer chains, such as hydrophilic polymer chains, which may be, for example, PEG or synthetic glycocalix chains that have different molecular weights. A total biodegradability time of the region or structure may, for example, range from 0.1 hours to 1000 hours, from 0.2 hours to 500 hours, from 0.4 hours to 200 hours, or any sub-range within these ranges.

In some embodiments, pores of the structure's porous region may contain a loading agent, such as a molecule or a nanoparticle. Types of loading agents which may be loaded in pores of the porous region are not particularly limited as long as a particular loading agent has dimensions, which allow it to penetrate the pores of the porous region. Examples of possible loading agents are disclosed, for example, in US Patent App. Pub. Nos. 2008/0311182, 2008/0280140 and 2003/0114366. In some embodiments, the loading agent may be a therapeutic agent and/or an imaging agent, as defined in US Patent App. Pub. Nos. 2008/0311182, 2008/0280140 and 2003/0114366.

Examples of nanoparticles, which may be used as loading agents, include, but are not limited to quantum dots; metal nanoparticles, such as gold and silver nanoparticles; metal oxide particles, such as iron oxide particles, silicon particles, $TiO_2$ particles, alumina particles; carbon based particles, such as carbon nanotubes and fullerenes; and organic particles, such as liposomes and micelles. Without being bound by theory, quantum dots used as a loading agent may enhance fluorescence from a porous region when such a region comprises porous semiconductor with fluorescent properties. One example of such semiconductors may be porous silicon.

In some embodiments, the porous structure may include multiple (two or more) regions, which may have different porous properties. For example, in some embodiments, the structure may include a first region and a second region, which is different from the first region in at least one property selected from pore size, porosity and pore orientation. In some embodiments, one of the first and second regions may be a non-porous region, while the other may be a porous region. Yet, in some embodiments, both the first and the second regions may be porous regions.

In many embodiments, the first and the second regions may be positioned along the axis of the structure adjacent to each other. In some embodiments, a transition between the first and second regions may be sharp, which may mean no more than 20 nm, no more than 10 nm, or no more than 5 nm. Yet, in some embodiments, a transition region between the first and second regions may be gradual (e.g., longer than 20 nm, longer than 30 nm, or longer than 40 nm).

Lengths along the axis of each region of the structure may also vary in some embodiments. For example, in some embodiments, each region of the structure may be at least 20 nm long, at least 40 nm long, at least 80 nm long, from at least 20 nm to no more than 1000 nm long (20-1000 nm), from at least 40 nm to about 800 nm long, from at least 80 nm to about 500 nm long, or any sub-range within ranges defined in this sentence.

In some embodiments, at least one of the first and second regions may be biodegradable. In some embodiments, both the first and the second regions may be porous or non-porous biodegradable regions. In such a case, a biodegradation kinetics (or rate) of the first and second region may be the same or different.

In some embodiments, pores of at least one of the first and second regions may contain at least one loading agent, such as a molecule or a nanoparticle. In some embodiments, pores of both first and second regions may contain at least one loading agent. In some embodiments, pores of the first region may be loaded with a first loading agent, while pores of the second region may be loaded with a second loading agent, which may be different from the first loading agent.

In some embodiments, the structure may contain more than two regions along its axis, so that each two adjacent regions have different porous properties. In some embodiments, such multi-region structures may have a periodically repeating pattern along its axis in one or more regions. Yet in some embodiments, the multi-region structure may have a random pattern of regions along its axis. Multi-region structures may be used for a variety of applications, such as, for example, barcodes.

The structures may be composed of a number of chemically etchable or porosifiable materials, which may be a chemically etchable or porosifiable semiconductor material, such as silicon, germanium, GaAs, InP, SiGe or GaP. In many embodiments, the semiconductor material may be a single crystal semiconductor material, such as a single crystal silicon or a single crystal germanium.

In some embodiments, a semiconductor material of the structure may be a doped semiconductor material. In some embodiments, the semiconductor material may be p-doped. Yet in some embodiments, the semiconductor material may be n-doped. A semiconductor material of the structure may have a variety of doping levels or concentrations. In many embodiments, a semiconductor material of a substrate from which the structure is formed may have such a doping level/concentration that the substrate has a surface resistivity ranging from 0.0002-20 $\Omega$-cm, from 0.0005-15 $\Omega$-cm, from 0.0008-10 $\Omega$-cm, or any sub-range within these ranges.

In some embodiments, the structure may be a high resistive structure. In some embodiments, the high resistive structure has a doping level/concentration that is substantially equal to a doping level/concentration of a bulk semiconductor having a high resistivity of at least 0.02 $\Omega$-cm, at least 0.05 $\Omega$-cm, at least 0.1 $\Omega$-cm, at least 0.2 $\Omega$-cm, at least 0.5 $\Omega$-cm, at least 1.0 $\Omega$-cm, from at least 0.02 $\Omega$-cm to no more than 12 $\Omega$-cm (0.02-12 $\Omega$-cm), 0.05-12 $\Omega$-cm, 0.1-12 $\Omega$-cm, 0.2-12 $\Omega$-cm, 0.5-12 Ω-cm, or 1.0-12 Ω-cm. Yet, in some embodiments, the structure may be a low resistive structure (e.g., a structure which has a doping level/concentration that is substantially equal to a doping level/concentration of a bulk semiconductor having a low resistivity of less than 0.02 Ω-cm, less than 0.01 Ω-cm or less than 0.05 Ω-cm).

Both high and low resistive structures may be either porous or non-porous. In some embodiments, the structure made of a semiconductor material may be a multi-doped structure, which has more than two or more regions, which differ from each other in a doping type and/or doping level or concentration and/or resistivity. Such a multi-doped structure may include a first doping region and a second doping region, which may differ from the first region in at least one property selected from a doping type, a doping level, concentration, or resistivity. For example, in some embodiments, the first doping region may be an N-doped region, while the second doping region may be a P-doped region, or vice versa. In some embodiments, the first doping region may be a high resistive region (e.g., a region which has a doping level/concentration that is substantially equal to a doping level/concentration of a bulk semiconductor having a high resistivity, as defined above). Likewise, in some embodiments, the second doping region may be a low resistive region (e.g., a region which has a doping level/concentration that is substantially equal to a doping level/concentration of a bulk semiconductor having a low resistivity, as defined above). In some embodiments, the first and the second doping regions may be positioned along the axis of the structure. Yet, in some embodiments, the first and the second doping regions may be positioned across the cross-section of the structure.

The first and the second doping regions may have the same or different porous properties, such as pore size, porosity and pore orientation. The multi-doped structure may comprise a junction or interface between the first and the second doping regions. Multi-doped structures may be used as semiconductor devices, such as p-n junctions, diodes or transistors.

Porous and nonporous structures may be prepared by a number techniques. In some embodiments, preparation of porous and non-porous structures involves depositing a porosification or etching assisting metal on a surface of a substrate. The porosification/etching assisting metal can be a metal. The metal can be at least partially dissolved in an etching solution to form a metal containing etching solution. The metal containing etching solution may also contain at least one of ions and atoms of the porosification/etching assisting metal. Examples of porosification/etching assisting metals include noble metals, such as silver and gold.

In many embodiments, the substrate comprises a chemically etchable or porosifiable semiconductor material, such as silicon, germanium, GaAs, InP, SiGe or GaP. In many embodiments, the substrate may be a single crystalline substrate, such as a single crystalline silicon substrate or a single crystalline germanium substrate. In some embodiments, the substrate may be an N-doped substrate. Yet, in some other embodiments, the substrate may be a P-doped substrate. In some embodiments, the substrate may have a constant concentration of a dopant, and thus a constant resistivity through its volume.

In some embodiments, the substrate may be a multi-doped substrate. In some embodiments, the multi-doped substrate may have multiple (two or more) doping regions, which differ between each other in at least one doping property, such as dopant type and doping level or concentration. For example, the substrate may include a first doping region and a second doping region, which is different from the first region in at least one doping property selected from a dopant type and a dopant concentration or level. The first and the second doping regions may be located along a thickness of the substrate, or across the surface of the substrate.

In some embodiments, the multi-doped substrate may also contain a junction at an interface between the first and the second doping regions. Such a multi-doped substrate may be used for forming multi-doped structures discussed above.

In some embodiments, the substrate in case of a constant resistivity substrate, or one of doping regions in case of a multi-doped substrate, may be a low resistivity substrate or region, which has a resistivity of less than 0.02 Ω-cm. Yet, in some embodiments, the substrate, in case of a constant resistivity substrate, or one of doping regions in case of a multi-doped substrate, may be a high resistivity substrate or region, which may have a resistivity greater than 0.02 Ω-cm, greater than 0.05 Ω-cm, greater than 0.1 Ω-cm, greater than 0.2 Ω-cm, greater than 0.5 Ω-cm, greater than 1.0 Ω-cm, greater than 2.0 Ω-cm, from 0.05 to 20 Ω-cm, from 0.1 to 20 Ω-cm, from 0.2 to 20 Ω-cm, from 0.5 to 20 Ω-cm, from 1.0 to 20 Ω-cm, from 0.05 to 12 Ω-cm, from 0.1 to 12 Ω-cm, from 0.2 to 12 Ω-cm, from 0.5 to 12 Ω-cm, or from 1.0 to 12 Ω-cm.

In some embodiments, a porosification/etching assisting metal may be deposited on the surface of the substrate from a solution, which may contain a compound, such as a salt, of the porosification/etching assisting metal. For example, in some embodiments, a porosification/etching assisting metal may be deposited by an electroless chemical deposition. Yet, in some embodiments, the metal may be deposited by an electrochemical deposition.

In some embodiments, the porosification/etching assisting metal may be deposited in a form of nanoparticles. For example, in some embodiments, gold nanoparticles may be deposited from a solution containing $HAuCl_4$. Yet, in some other embodiments, silver nanoparticles may be deposited from a solution containing $AgNO_3$.

In some embodiments, nanoparticles of the porosification/etching assisting metal may be deposited from a dispersion containing such nanoparticles. For example, the nanoparticles may be spin cast or drop cast from the dispersion.

In some embodiments, the porosification/etching assisting metal may be deposited by a physical vapor deposition technique, such as sputtering, thermal evaporation or e-beam evaporation.

In some embodiments, a porosification/etching assisting metal may be deposited as a patterned layer, which may contain an opening exposing a portion of the substrate's surface.

Lateral dimensions of such an opening may define lateral dimensions of a later formed porous wire's cross-section. The patterned layer may be formed by using a shadow mask, which may define lateral dimensions of the opening. In some embodiments, a layer of a porosification/etching assisting metal may be deposited over the mask. In some embodiments, the mask may be formed directly on the surface of the substrate. Yet, in some embodiments, the mask may be formed between a source of the deposited porosification/etching assisting metal and the surface of the substrate, but not directly on the substrate's surface. Such a scenario may be applicable, for example, when the porosification/etching assisting metal is deposited using a physical vapor deposition technique. When the mask is formed directly on the surface of the substrate, the mask may or may not be later removed.

The shadow mask may be formed by a number of techniques. In many embodiments, the technique used for forming a shadow mask may be a microlithographic or nanolithographic technique, such as photolithography, e-beam lithography, nanoimprint lithography, nanoparticles assisted lithography or dip pen nanolithography.

In some embodiments, the shadow mask may comprise a dielectric material, such as silicon nitride. In some embodiments, the shadow mask may comprise one or more nanoparticles, which can be polymer nanoparticles, such as polysterene beads.

In some embodiments, the shadow mask may comprise a patterned polymer layer, which may be a self-assembled polymer layer.

A porosification/etching assisting metal layer may be deposited over the shadow mask by a number of techniques, including chemical techniques, such as electroless deposition and electrochemical deposition, and physical techniques, such as thermal evaporation, e-beam evaporation and sputtering.

The shadow mask may or may not be removed. To remove the shadow mask, one may use a number of techniques, which may include, for example, dissolution, sonication and liftoff. For example, in some embodiments, the mask may be dissolved. The use of a particular solvent may depend on a material of a mask. For example, a SiN mask may be removed by using HF as a solvent. Likewise, a photoresist mask may be removed by using an organic solvent, such as acetone. Similarly, toluene may be used for removing a polysterene mask. In some embodiments, the mask may removed by sonication (e.g., use of ultrasound). Sonication may be preferred for removing nanoparticles, such as nanospheres, in nanoparticle assisted lithography.

In some embodiments, the porosification/etching assisting metal may be deposited as a part of exposing the substrate to an etching solution, which may comprise HF; an oxidizer, such as $H_2O_2$ or $HNO_3$; or a compound of the porosification/etching assisting metal, which may be, for example, $HAuCl_4$ or $AgNO_3$.

In some other embodiments, after the porosification/etching assisting metal is deposited on the substrate's surface, the substrate may be exposed to an etching solution, which may dissolve at least partially the porosification/etching assisting metal to form a metal containing porosification/etching solution. The etching solution may comprise HF and an oxidizer, which may be, for example, $H_2O_2$. In addition, the etching solution may also contain water and optionally a surfactant, which may be an alcohol, such as methanol or ethanol. Depending on (i) concentrations of components of the etching solution, (ii) a resistivity of the substrate and (iii) a type of the porosifying/etching assisting metal used, the exposure to the etching solution may result in the formation of one of the following structures: a) solid, i.e. non-porous structures; b) porous structures; c) porous structures on a porous substrate; d) porous substrate with no structures; and e) non-porous polished substrate with no structures.

A concentration(s) of one or more components, such as HF; an oxidant, such as $H_2O_2$; and/or a surfactant, such as ethanol, of the etching solution may be selected to be effective to produce a particular desired structure (from (a) to (e)) for a particular porosification metal used and a resistivity of the substrate. For determining such effective concentrations, one can use phase diagrams, such as those presented in FIG. 8 for silicon substrates.

A concentration(s) of one or more components, such as an oxidizer and a surfactant, of the etching solution may also be used to tune one or more porous properties, such as pore size, porosity or pore orientation of the produced porous structures or porous regions of structures. For example, the use of an etching solution, which has a greater concentration of an oxidizer, such as $H_2O_2$, may result in a greater pore size and porosity than the use of etching solution that has a lower concentration of the oxidizer under otherwise identical conditions.

The pore orientation may be tuned by varying a relative ratio of a porosification rate (i.e., a rate of forming pores in the porous structure or region) to an etching rate (i.e., a rate of etching out a portion of the substrate around the structure, which may be done by varying for example, a concentration of a surfactant, such as ethanol, in the solution).

In some embodiments, a concentration(s) of one or more components of the etching solution, such as HF; an oxidant, such as $H_2O_2$; and/or a surfactant, such as ethanol may be selected to be effective to produce a porous structure or region with preselected porous properties, such as pore size, porosity and pore orientation, for a particular porosification metal used and a resistivity of the substrate. For determining such effective concentrations, one may use phase diagrams, such as those presented in FIG. 8 for silicon substrates.

In some embodiments, a concentration of at least one component of the etching solution may vary during the exposure. For instance, the substrate with the porosification/etching assisting metal may be first exposed to a first composition of the etching solution and then to a second composition of the etching solution, which has a concentration of at least one component different from that of the first composition of the etching solution. For example, the first composition and the second composition may have different concentrations of an oxidizer, such as $H_2O_2$; different concentrations of a surfactant, such as ethanol; or different concentrations for both the oxidizer and the surfactant.

Varying a concentration of at least one component of the etching solution may result in forming two distinct regions adjacent to each other along the length of the structure, which differ in at least one porous property, such as a pore size, porosity and pore orientation. For instance, the concentration varying may allow forming a first region and a second region, such that the second region has at least one porous property different than from that of the first region. In some embodiments, both first and second regions can be porous regions. Yet, in some embodiments, only one of the first or second regions may be porous, while the other region is non-porous (i.e. solid). To form a solid region, one can use concentrations in the etching solution for forming a solid wire like structure for a given metal and a given resistivity. Varying a composition of the etching solution may allow producing structures, which have patterned porous properties. Varying a composition of the etching solution may allow controlling of a relative position of each region with respect to one or more other regions.

In some embodiments, a surface of pores of the porous region(s) may be modified, for example, chemically and/or electrostatically. For example, in some embodiments, when the structure comprises silicon, its pore surface may be oxidized using, for example, oxygen plasma. Various methods of modification of porous surfaces are disclosed, for example, in the following patent applications: US Pat. Publication Nos. 2008/0311182, 2008/0280140 and 2003/0114366; and PCT Application No. PCT/US2009/000239. Surface modification may affect a biodegradation rate of the porous structures or porous regions.

Upon forming a porous structure or region, one may load its pores with a loading agent, which may be, for example, a molecule or a nanoparticle. Methods of loading molecules and nanoparticles into micro/nano scale porous particles are disclosed, for example, in the following patent applications: US Pat. Pub. Nos. 2008/280140 and 2003/0114366; and PCT Publication Nos. W0/2008/0219082 and W0/1999/53898.

When the porous structure comprises more than one porous region, one porous region may be loaded with a first loading agent, while another porous region may be loaded with a second loading agent, which is different from the first loading agent. For example, when a porous structure includes a first porous region and a second porous region, which has a pore size smaller than the first region, one can first load pores of the first region with a first loading agent, which can include particles having a size greater than the second region's pore size but less than the first region's pore size. Then, one can load pores of the second region with a second loading agent.

In some embodiments, porous structures, including elongated porous structures, such as porous wire-like structures or porous ribbon or belt like-structures, may be prepared from non-porous structures by exposing them to a porosifying solution electrolessly. The non-porous structures may be obtained as disclosed above. The porosifying solution may contain HF; an oxidizer, such as $H_2O_2$; at least one atom ions of a porosification/etching assisting metal; and optionally a surfactant, such as ethanol. The porosifying solution may also contain ions and/or atoms of a porosification/atoms assisting metal. The porosifying solution may be a fresh porosifying solution or a used porosifying solution (i.e. a solution previously used for preparing another porous structure).

APPLICATIONS

Porous and non-porous structures disclosed above may have a number of applications. Such applications may include, without limitation: devices, such as electro-optical devices; sensors; solar cells; nanomechanical devices; nanowires, such as drug delivery nanoneedles and bar-coded wires; and imaging agents. In particular, for porous structures disclosed above, applications may include high surface area electrodes, biodegradable circuits, thermoelectric devices, biosensors, electromechanical devices, drug delivery vehicles (vehicles for delivering an active agent, which may be a therapeutic and/or imaging agent), and biolabeling.

In some embodiments, porous structures may be used in devices, such as supercapacitors or photovoltaic cells. Such devices may draw significant advantages from electrodes with high surface area, since such electrodes may increase the active interface for charge storage and harvesting, respectively.

In some embodiments, silicon porous structures may be preferred for various reasons. For instance, silicon may be the best performing material for charge harvesting, and for increasing the active interface. At the same time, silicon may reduce the characteristic length the charge has to travel before being collected. Thus, Applicants envision that such properties can result in an improved device efficiency. Accordingly, in more specific embodiments, porous and non-porous structures of the present invention are silicon nanowires, such as multi-layered, nanoporous silicon wires.

In some embodiments, arrays of porous structures, such as arrays of silicon porous structures, may be employed as at least one of the two parts of the p-n junction, which may improve the efficiency of solar cells. Supercapacitors rely on the separation of charge across the electrode. Thus, porous structures, such as porous silicon structures, may be exploited in supercapacitor devices, owing to their suitable electrical properties and elevated surface area, in a manner similar to the use of carbon-based materials, such as active carbon, nanotubes and graphene, in current supercapacitor devices.

In some embodiments, porous structures, such as porous silicon structures, may be used in a biodegradable circuit. In some embodiments, the entire biodegradable circuit (i.e. both active and passive components) may comprise porous elongated structures, such as porous silicon structures. In certain embodiments, this can be accomplished by first patterning, such as lithographic patterning (e.g. photolithogaphic patterning) the circuit on a substrate, such as a silicon substrate, and then transferring the patterned circuit to a biodegradable substrate. Yet, in some embodiments, the biodegradable circuit may be assembled from the elongated porous structures through the guided assembly directly on a biodegradable substrate. In some embodiments, only active components of a biodegradable circuit, such as junctions and transistors, may comprise porous silicon structures. Passive components in such embodiments may comprise a thin metal layer or sheet, or a biodegradable conductive material, which is different from a biodegradable material of the porous structures.

In some embodiments, the porous structures for such a biodegradable circuit may be formed by patterning, such as lithographic patterning (e.g. photolithographic patterning) the structures on a substrate, such as a silicon substrate. The structure may subsequently be transferred to a biodegradable substrate. Yet, in some embodiments, the biodegradable circuit may be assembled by directed assembly on a biodegradable substrate.

In some embodiments, the porous structures may be utilized in an electronic device with an elevated sensitivity to the external environment, such as a sensor. Such a device may exploit the high surface area of the porous structures. In some embodiments, the porous structures used in the device may be biodegradable, thereby allowing the use of the device as an implantable device. The specificity of the device with the elevated sensitivity may be modulated either by tuning the pore size, or by pore surface functionalization with labeling agents, or a combination thereof.

In some embodiments, the disclosed porous structure(s) may be used in an electromechanical sensing device, which may measure the change in mass or mechanical properties of the porous structure associated with the structure's interaction with the environment. The elevated surface area of the porous structure may result in a high sensitivity and/or specificity, which may be tuned by tuning the pore size and/or by surface functionalization with labeling agents, or a combination thereof.

Due to their porous nature, biodegradability and biocompatibility, the disclosed porous structures of the present invention may also be utilized for delivery of an active agent, such as a therapeutic and/or imaging agent in vivo. Control of one or more properties along the structure's axis and surface functionalization can be exploited to differentially load active agents within different segments of the structure. Such control can also to tune the degradation rate of the structure and thus the release rate of the active agent. In more specific embodiments, the active agent may be an anti-cancer agent. In further embodiments, the active agent may be housed in a nanoparticle.

In some embodiments, the disclosed porous structures may be used as a primary delivery vehicle. Yet, in some embodiments, the porous structures may be used as one of the stages of a multi-stage delivery system, such as the one disclosed in US Patent Application Publication No. 2008/031182 or Tasciotti et al., Nature Nanotechnology, vol. 3., 151-158, 2008. Photonic characteristic, such as photoluminescence of the structure, may allow determining by optical analysis the loading state of the structure by observing the shift in an optical spectrum (e.g., a reflection spectrum). In more specific embodiments, the delivery vehicle may be used treat a cancer or reduce a tumor size.

In some embodiments, the ability to tune a photonic property of the structure, such as photoluminescence along its axis, may be exploited for as a label. For example, conjugation of recognition moieties to the structure's surface may permit tagging and unique labeling by means of a non-bleaching, biodegradable, biocompatible, tag, which may be observed by clear field microscopy, fluorescence microscopy or simultaneously by clear field and fluorescence microscopy.

In some embodiments, the disclosed porous structure, which may have multiple regions along the structure's axis with different photonic properties, may be used as a barcode or an indicator. Embodiments described herein are further illustrated by, though in no way limited to, the following working examples.

WORKING EXAMPLE 1

Silicon nanowires are intensively investigated in diverse fields such as energy production and storage, flexible electronics, and biomedicine due to the unique characteristics emerging from their one-dimensional semiconducting nature and their mechanical properties. Here, we show the synthesis of biodegradable porous silicon nanowires by metal assisted electroless etch of single crystal silicon with resistivity ranging from 0.0008 Ω-cm to 10 Ω-cm. Multicolor reflection and photoluminescence from a single porous silicon nanochain with periodically varying porosity was characterized. The geometry of porous nanowires was defined by nanolithography. Phase diagrams were developed to describe the synthesis of different nanostructures as a function of metal employed, $H_2O_2$ concentration, ethanol concentration and silicon resistivity. A mechanism has also been proposed to explain these observations. It was proven that porous silicon nanowires are biodegradable, and their life time can be modulated by surface treatments.

The quantum sponge structure of Porous Silicon (pSi) has attracted interests for potential applications in very diverse fields due to the combination of quantum confinement effects[1-3] (the superscript numbering refer to the list of References infra); permeability to molecules[4-7] and nanoparticles[8,9]; and large internal surface active for interaction[10]. PSi biodegradability, biocompatibility[11] and sponge-like structure stimulated research for biomedical applications in implantable devices[12,13], drug delivery systems[8,14-16] and tissue engineering scaffolds[17-19]. PSi tunable photoluminescence in the infrared to visible region holds promise for the development of biocompatible nonbleaching fluorophores for in-vitro and in-vivo biolableing[8,20,21]. The regularity of the pore structure of electrochemical etched pSi results in defined absorption and emission bands. Such results are in contrast to stain or photochemical etch that warrant less control over the porous structure[22,23].

Silicon nanowires (i.e., SiNWs) are intensively studied for photovoltaics[24], energy storage[25], nanoscale electronics[26-28] and flexible[29] electronics. Multicolor luminescence of porous silicon[30] and silicon nanowire arrays[31] have attracted significant interest for the realization of versatile optoelectronic devices. The one-dimensional structure and the mechanical properties of SiNWs have been exploited to study the behavior of motor proteins[32]. SiNW templated surfaces have contributed to the understanding of cell adhesion mechanisms[33]. Several biosensors based on SiNWs have been developed for glucose monitoring[34], multiplexed protein detection[35], label-free DNA detection[36], single-virus detection[37] and drug discovery[38]. Recently, metal-assisted etch in an oxidant HF solution has emerged as a method to obtain both porous silicon[39] and silicon nanowires[40]. SiNW hierarchical superstructures have recently been synthesized and employed for the realization of diodes and transistors[41]. As we are working on this research, the formation of porous silicon nanowires (pNWs) from low resistivity p-type silicon by electroless etch in a solution of HF, $H_2O_2$ and $AgNO_3$[42], and pNWs from low resistivity n-type silicon by electroless etch in a solution of HF, $H_2O_2$ following deposition of Ag nanoparticles in a solution of HF and $AgNO_3$[43] were reported. No reports have so far shown formation of pNWs from higher resistivity silicon, or control over nanowires geometry and porous structure.

In the present study, metal assisted electroless etch was employed to synthesize multilayer porous silicon nanowires. Each layer characteristic pore size was associated with a specific UV-visible absorption and emission spectra to yield multi-color nanochains. The layer-dependent pore size was exploited to enhance the multicolor fluorescence by differential loading of quantum-dots (Q-dots). The ability to fabricate porous silicon one-dimensional nanostructures with geometry defined by lithography was demonstrated. Phase diagrams were developed to describe the effect of metal nanoparticles employed, composition of the etching solution, Si doping type and concentration on the resulting silicon nanostructures: solid nanowires, porous nanowires, porous nanowires on porous silicon film, porous silicon films and polished surfaces. It was demonstrated that porous silicon nanowires dissolve in simulated physiological conditions, and their dissolution rate can be controlled by surface functionalization.

Porous Silicon Nanochains

Figure 2:
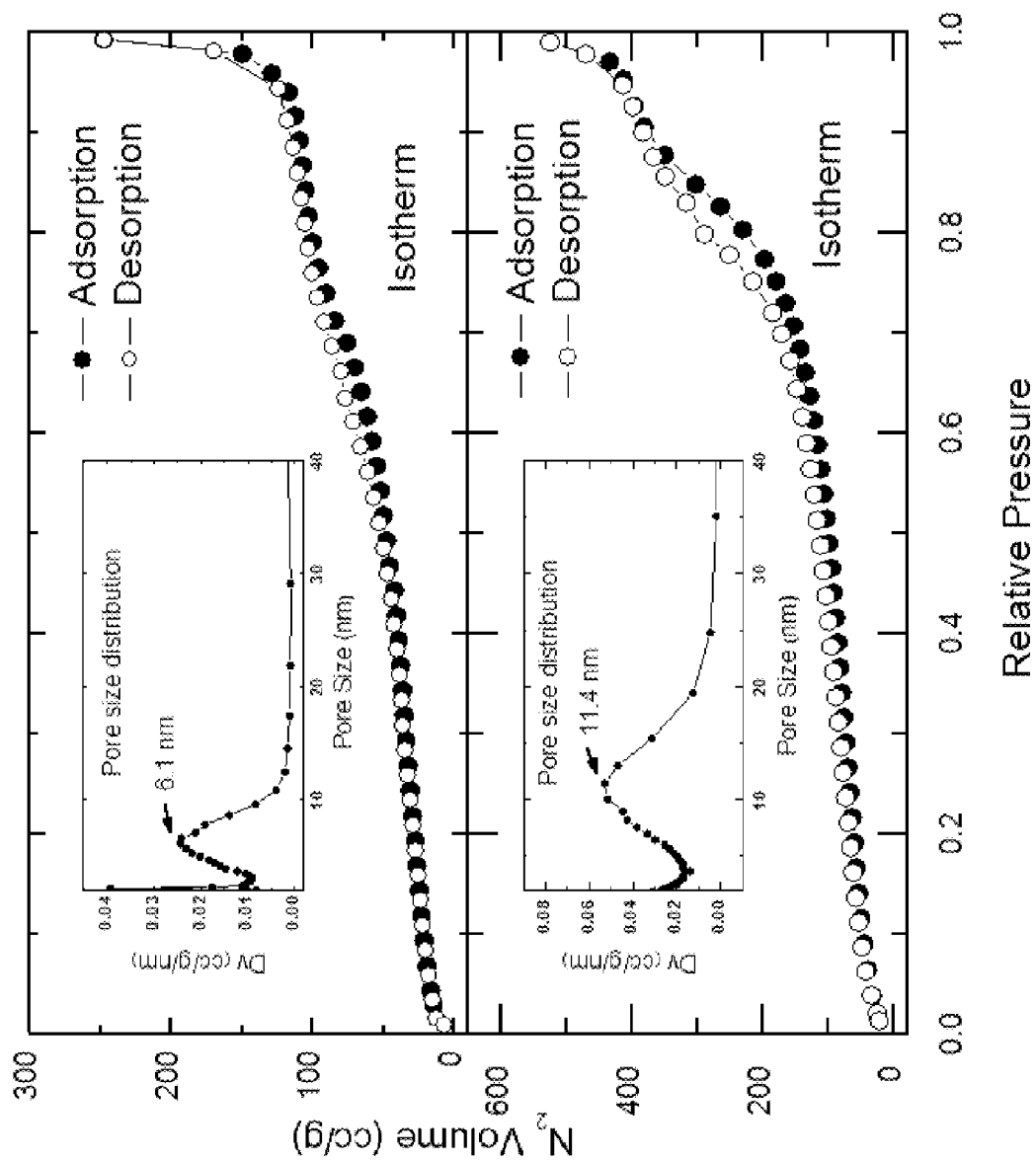
FIG. 2 shows results of pore size measurement using the BJH model. Pore size and porosity increases as a function of $H_2O_2$ concentration. $N_2$ absorption/desorption isotherms for <0.005 Ω-cm porous silicon nanowires synthesized in 0.1M $H_2O_2$ (top) and 0.2M $H_2O_2$ (bottom). Pore size as measured by BJH model increases from 6.1 nm to 11.4 nm, associated with an increase in BET measured porosity from 47% to 66%.
Figure 3:
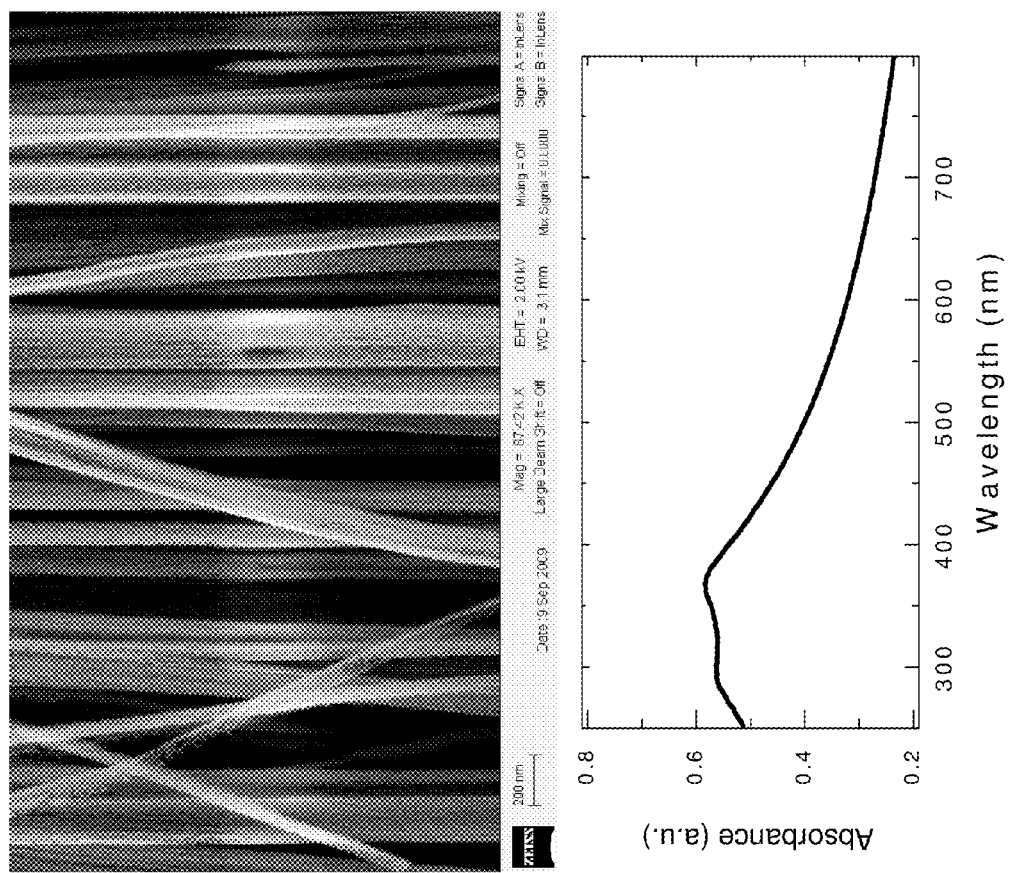
FIG. 3 shows scanning electron micrograph (top panel) and absorbance spectrum (bottom panel) of <0.005 Ω-cm porous silicon nanochains etched in 0.05M $H_2O_2$, 2.9M HF and 0.2M $H_2O_2$, 2.9M HF solutions.
Figure 4:
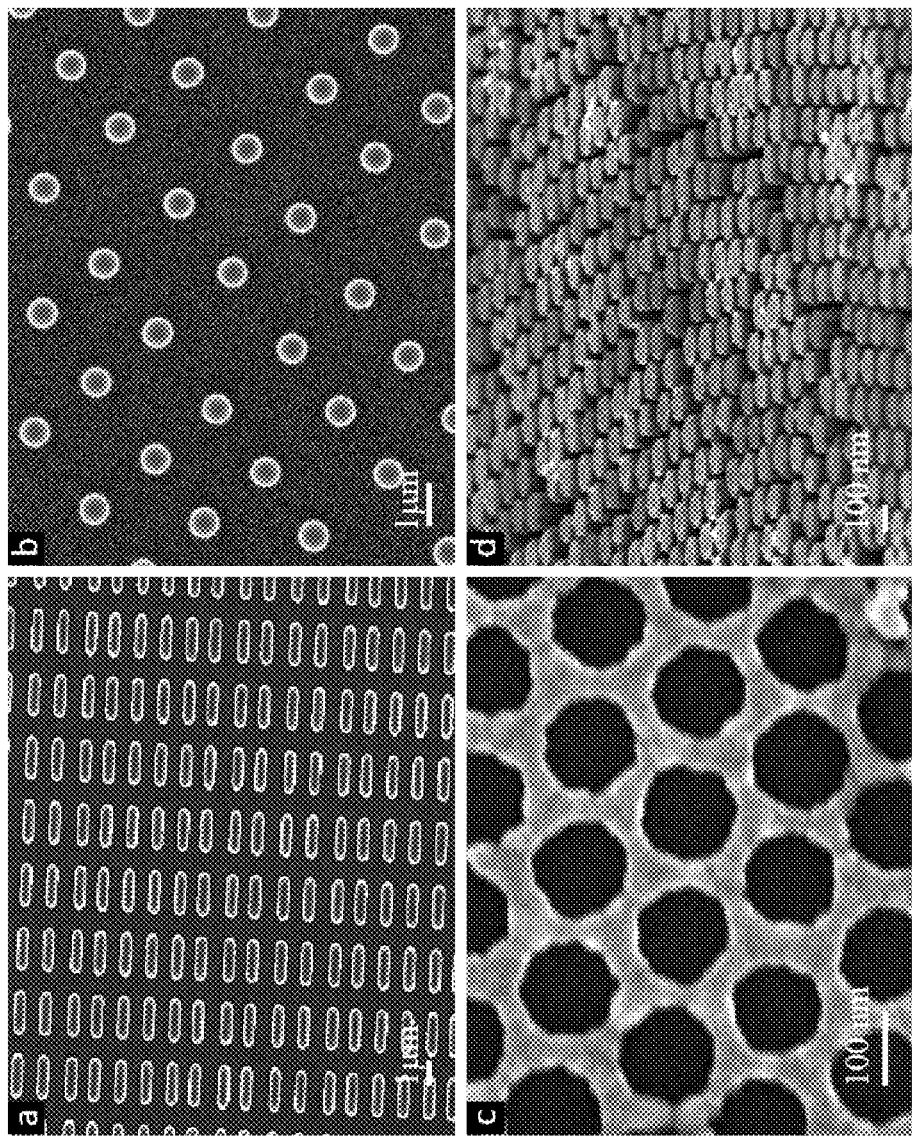
FIGS. 4 (a)-(d) are scanning electron micrographs of nanopatterned porous silicon structures.

Multicolor-photoluminescent porous silicon nanochains (or barcode nanowires) were synthesized by periodically varying the porosity along the major axis of the nanowires (FIG. 1 a). The color-photoluminescence characteristic of each chain link was determined by its porosity. The porosity was modulated by means of a time variable hydrogen peroxide concentration in a 2.9M HF aqueous solution; higher concentration of $H_2O_2$ resulted in higher porosity and larger pores as indicated by $N_2$ absorption/desorption isotherms. P-type silicon wafers with resistivity <0.005 Ω-cm etched in 0.1M $H_2O_2$ resulted in 47% porosity and 6.1 nm peak pore size as measured according to the Brunauer-Emmett-Teller (BET) analysis and Barrett-Joyner-Halenda (BJH) methods, respectively. However, the same substrates etched in 0.2M $H_2O_2$ resulted in 66% porosity and 11.4 nm pores (FIG. 2). The scanning electron microscope (SEM) analysis showed that the porosity transition between chain links occurred within few nanometers, indicating a prompt response to the variable $H_2O_2$ concentration (FIG. 1 a, and also FIG. 3).

The two-color nanochains exhibited sharply defined, spatially varying colors under (3200K halogen lamp) white light as a result of the different reflection spectrum associated with each chain link (FIG. 1 d). The multicolor photoluminescence of the synthesized nanochains was measured in a photoluminescence spectrometer. The photoluminescence of low-porosity nanowires (synthesized in solution containing 0.05M $H_2O_2$), high porosity nanowires (0.2M $H_2O_2$) and two-color nanochains (six alternated low-porosity, high-porosity links) suspended in isopropyl alcohol was analyzed. The low porosity nanowires exhibited a broad emission peak centered at 450 nm, while high porosity nanowires showed a similar peak centered at 540 nm (FIG. 1 c).

Without being bound by theory, it is envisioned that the photoluminescence of the nanochains was the result of the superposition of spatially distinct contribution from low and high porosity chain links. In fact, the photoluminescence spectrum of the nanochains matched the superposition of the individual spectrum of high porosity nanowires and low porosity nanowires (FIG. 1c). Furthermore, confocal microscopy analysis of the two-color nanochains under 458 nm laser showed alternating dark and bright areas that matched respectively the high and low porosity chain links (FIG. 1b).

Porous silicon photoluminescence quantum efficiency is known to be low[44], and might not be sufficient for applications in environments with elevated background noise. Also the absorption band of porous silicon nanowires may fall in the UV range (FIG. 3, the absorption spectrum of high porosity nanowires (0.2M $H_2O_2$)). This may in turn limit their practical application.

Highly efficient multicolor fluorescent nanochains by differential loading of Q-dots in the pores of nanochains (FIG. 1e) were obtained. Bare CdSe red Q-dots (6.6 nm diameter, 633 nm emission) and yellow Q-dots (3.3 nm diameter, 560 nm emission) were loaded into the pores of nanochains. The spectrum of loaded nanochains showed two sharp peaks centered at the emission wavelength associated with the Q-dots (FIG. 1f). Three channel confocal fluorescence microscopy indicated that the larger red Q-dots only loaded into the large pore, high porosity chain links, while the smaller yellow Q-dots loaded almost exclusively into the small pore, low porosity chain links resulting in a high efficiency fluorescent two-color nanochain (FIG. 1e).

Patterned Porous Silicon Nanowires

Figure 5:
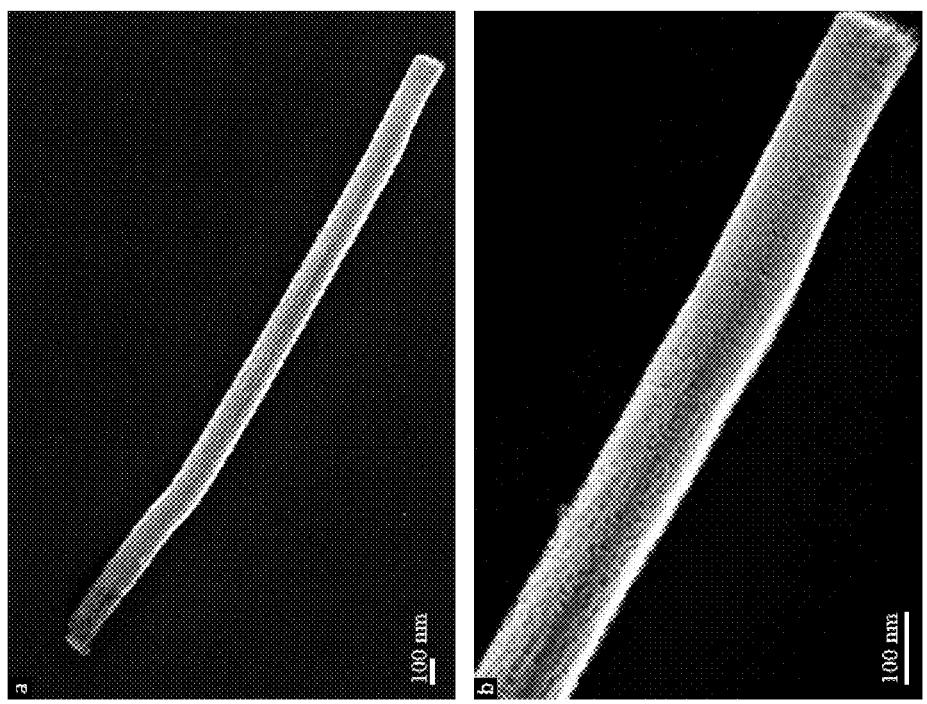
FIGS. 5 (a)-(b) show scanning electron micrographs of multicolor porous silicon nanopillars.

While the simple deposition of metal from HF-metal salt solution allowed for the facile synthesis of porous silicon nanowires, it did not grant control over the shape, size and array density of the nanowires. Yet, tightly controlled geometry of porous silicon nanostructures is desired for practical applications, such as integrated optical and sensing systems. Nanolithographic processes were integrated with the two-step metal-assisted synthesis of porous silicon nanowires. Control over the geometry of the porous silicon nanostructures was demonstrated using both nanosphere lithography and photolithography. Nanosphere lithography provided a facile and inexpensive method to control the diameter of nanopillars. Photolithography granted control over position, density, shape, and size of the nanoporous structures (FIG. 7). Coupling nanosphere lithography with the ability to form nanochains yielded multi-link nanopillars (FIG. 5).

Biodegradation of Porous Silicon Nanowires

Figure 6:
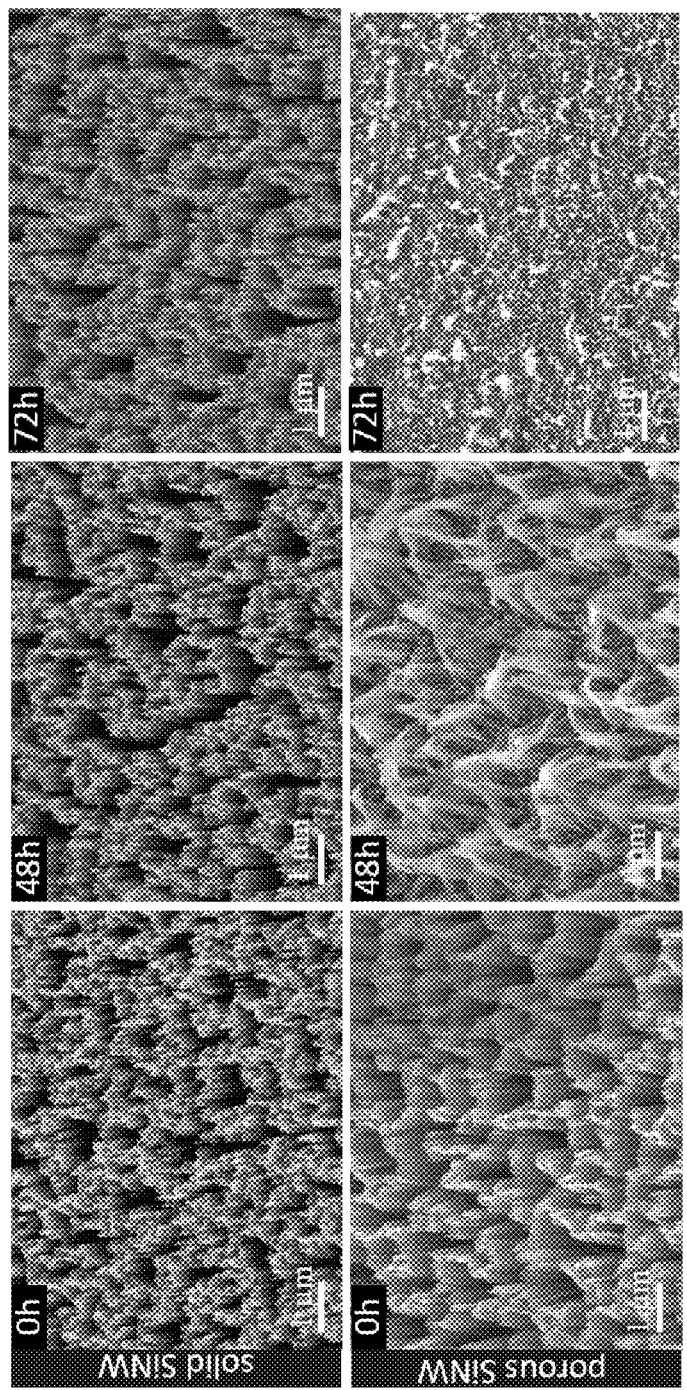
FIG. 6 presents scanning electron micrographs studying degradation of porous silicon nanowires vs. solid silicon nanowires.
Top panel shows scanning electron micrographs of non-oxidized 0.01-0.02 Ω-cm solid silicon nanowires following immersion in phosphate buffered saline. No degradation is observed within a 96 h timeframe.
Bottom panel shows scanning electron micrographs of oxidized <0.005 Ω-cm porous silicon nanowires following immersion in phosphate buffered saline. The porous nanowires show significant signs of degradation with loss of flexural module at 48 h without exhibiting shortening. The wires are completely degraded after a 72 hour immersion.
Figure 21:
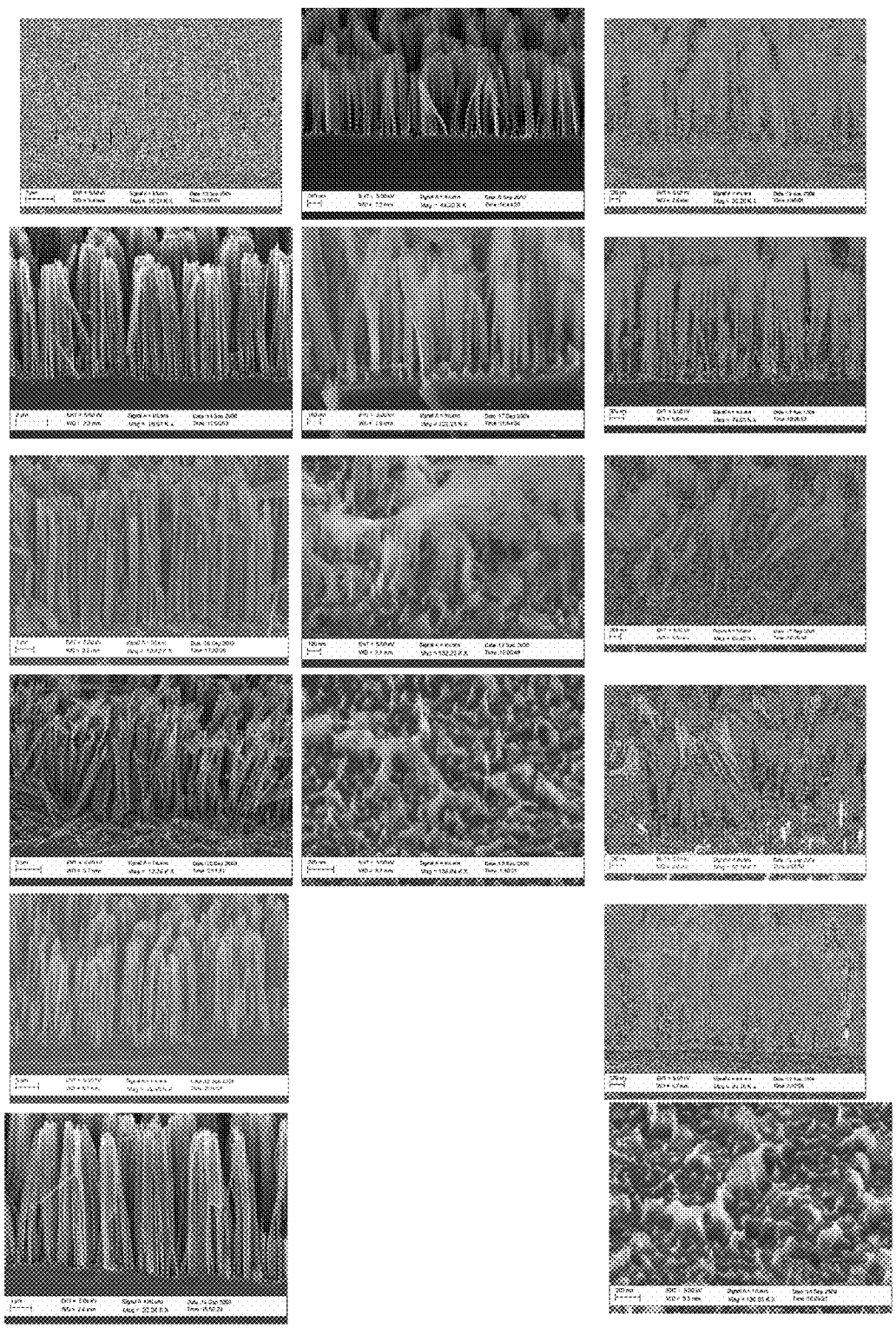
FIG. 21 present SEM images of silicon nanowires kept in PBS for different time periods.

To probe the adequacy of porous silicon nanowires and nanochains as building blocks for biodegradable circuits, the behavior of the nanowires was investigated in simulated physiological conditions. The nanowires were placed in phosphate buffered saline for up to 96 hours and analyzed by scanning electron microscopy (FIG. 6). We observed that, as synthesized <0.005 Ω-cm porous silicon nanowires degraded completely in 24 hours, the same nanowires that underwent oxygen plasma oxidation degraded in 72 hours. This indicates that surface functionalization influences the degradation rate. Conversely, 0.01-0.02 Ω-cm non-porous nanowires did not show obvious degradation over a 96 hour experimental period. The pNW displayed a progressive thickness reduction without exhibiting significant shortening and became more flexible over time, as evidenced by their autonomous bending (FIG. 6, porous SiNW, 48 hours). Pore size increased with time in accord with the degradation rate. As synthesized porous silicon nanowires more than doubled their pore size within 16 hours, whereas oxidized nanowires did not exhibit appreciable pore size increase until 48 hours.

Formation of Silicon Nanostructures

The metal assisted etch of silicon resulted in the synthesis of nanostructures with different morphologies depending on few key process parameters. FIG. 7 shows SEM micrographs of the five distinguishable morphologies resulting from the Au and Ag assisted etch of silicon: solid nanowires (FIG. 7a, sNWs), porous nanowires (FIG. 7b, pNW), porous nanowires on the top of porous silicon film (FIGS. 7c-d, pNW+PS), porous silicon films (FIG. 7e, PS) and polished silicon surfaces (FIG. 7f). The key parameters controlling the resulting morphology were silicon resistivity, $H_2O_2$ concentration, metal employed, and concentration of surfactant (ethanol). HF concentration only influenced the etch rate.

The effects of the controlling parameters were illustrated in a series of phase diagrams (FIG. 8). The phase diagrams indicated a well defined, smooth morphological transition sequence from sNWs to pNWs to pNW+PS to PS (when present) to polished surfaces. Substrates of low resistivity transitioned to every successive morphological state at lower concentrations of $H_2O_2$ than their high resistivity counterparts. Substrates <0.005 Ω-cm formed sNW only at $H_2O_2$ concentrations lower than 0.03M, while 0.0008-0.001 Ω-cm substrates did not form sNW in any condition examined, but formed very flexible thin spaghetti-like pNWs on porous silicon for low $H_2O_2$ concentrations (FIG. 7d). The walls of these spaghetti-like pNWs coincided with the walls of the underlying porous layer. These same nanostructures were obtained under comparable conditions employing n-type silicon, indicating that doping type does not play a significant role in determining the type of nanostructures that can be obtained.

With all other parameters fixed, decreasing the resistivity of silicon induced a smooth transition in the morphology phase diagram from sNWs towards polished surfaces (FIG. 8a, b, e). The same smooth sNWs to polished surface transition was observed when increasing the concentration of $H_2O_2$ in the etch solution while all other parameters were kept fixed (FIG. 8a,b). With increasing $H_2O_2$, the cross section of the porous nanowires reduced in diameter until it identified with the thickness of the underlying porous silicon walls. Further increasing the $H_2O_2$ concentration induced the disappearance of the SiNWs resulting in either PS or polished surfaces. $H_2O_2$ concentration and silicon conductivity were also positively correlated with average pore size and porosity of the porous nanowires (FIG. 2). The SEM analysis indicated that thinner nanowires and nanowires with larger pores were more prone to bend autonomously, suggesting a lower flexural module.

The noble metal employed affected the morphological transition boundaries. Au assisted etch formed porous structures for substrates with resistivity as high as 1-10 Ω-cm, while Ag only formed porous structures up to 0.1-0.2 Ω-cm. The phase space region for the formation of pNW was wider for Au than it was for Ag. In addition, polishing of the surface was less likely to occur while employing Au than Ag. In addition, any Au-based polishing of the surface occurred for higher $H_2O_2$ concentrations than with Ag.

Upon addition of ethanol (to improve the wetting of the water-based solution on the silicon surface), the smooth sequential transition from sNW to polished surface was observed again. This was characterized by the presence of a PS morphological phase in between the pNW+PS and the polishing phases (FIG. 8e).

The SiNW etch rate was positively correlated with resistivity from 0.0008-0.001 Ω-cm to 1-10 Ω-cm substrates (FIG. 8c). Etch rate was positively correlated with $H_2O_2$ concentration from 0.05M to 0.8M (FIG. 8d). Increasing the concentration of ethanol instead decreased the SiNW etch rate (FIG. 8f). The etch rates for Au and Ag were comparable in all instances. The decrease in etch rate associated with increasing ethanol coupled with the decrease in etch rate associated with decreasing substrate resistivity explained the absence of pNWs and the formation of PS observed for substrates with resistivity lower than 0.01-0.02 Ω-cm at elevated ethanol concentration.

A remarkable difference in the porous structure of pNWs and pNW+PS was observed (FIG. 9). pNWs pores grew from the side of the SiNW wall towards its major axis (FIG. 9a). However, pNW+PS pores grew parallel to the SiNW walls, along the SiNW etch direction (FIG. 9b). In addition, the pores extended as continuous structures from the pNW layer into the underlying PS layer. The evolution of the porous structure orthogonal to the pNW wall was illustrated in enlarged nanowire patterns (5 µm circular array, FIG. 10). These patterns indicated that the difference in porous structure between pNWs and pNW+PS may be the result of a different formation mechanism. A porosification rate slower than the SiNW etch rate characterized solid or partially porosified SiNWs and resulted in the porosification of the SiNW walls after they were formed by the metal nanoparticle assisted etch (FIGS. 9a, c). A porosification rate matching the SiNW etch rate characterized pNWs (FIG. 7b). On the contrary, a porosification rate faster than the SiNW etch rate characterized pNW+PS and resulted in the formation of a porous silicon layer that was then partially etched into SiNWs by the action of the metal nanoparticles (FIGS. 9 b, d).

One recently proposed model may indicate that the formation of nanowires using two-step metal assisted etch may be catalyzed by the primary deposited metal nanoparticles (NPs) while the porosification is catalyzed by secondary nanoparticles resulting from aggregation of ions shed by the primary nanoparticles[43]. Although the present invention is not limited by its theory of operation, the present results appear not to support the previously proposed model and may suggest an alternative hypothesis, where SiNW formation may be catalyzed by the primary nanoparticles (NPs) while the porosification may be catalyzed by the metal ions in solution without formation of secondary NPs. Support for this hypothesis may stem from the observation that metal NP were not detected within the pores of the SiNW or at the bottom of the porous layer by SEM or TEM analysis. Furthermore, since all the detectable NPs in pNW+PS accumulated at the interface between the nanowires and the porous layer, it appears unlikely for them to be the catalyst for the formation of the PS layer (FIGS. 7c-e, FIG. 9b).

Also, formation of porous silicon layers on blank wafers was observed when placed in the same solution as the metal deposited ones, either during the metal assisted etch, or after it was completed without any detectable metal NP on the blank wafers. However, no porosification occurred on blank wafers in electrolyte solution alone (FIG. 11). Within the framework of this model, the different morphologies obtained may be explained in terms of the relative catalytic activity of the ions ($C_i$) that determined the porosification rate and the catalytic activity of the nanoparticles ($C_n$) that determined the SiNW etch rate. $C_i$ and $C_n$ can be operationally defined in terms of the porosification rate ($v_p$) and SiNW etch rate ($v_r$), respectively:

$$C_i = v_p = \frac{\Delta x_p}{\Delta t_p}$$

$$C_n = v_s = \frac{\Delta x_s}{\Delta t_s}$$

Where $\Delta x_p$ is the thickness of the porous layer formed during a porosification time $\Delta t_p$ and $\Delta x_s$ is the length of the nanowires obtained during an etch time $\Delta t_e$ (FIGS. 6 c, d). Then the catalytic activity ratio ($C_0$) may be defined as $$C_0 = \frac{C_i}{C_n} = \frac{v_p}{v_s} = \frac{\Delta x_p}{\Delta x_s}$$

since it is always possible to choose $\Delta t_p = \Delta t_e$.

In support of this hypothesis, the experiments showed that that, increasing the concentration of ethanol reduced $v_s$, indicating a reduction in $C_n$ (FIG. 8f) by the oxidation reduction reaction involving Ag as catalyst (analogous holds for Au)

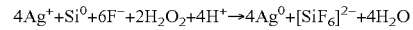

does not require the contribution of ethanol. Thus, the ethanol concentration may not affect $C_i$.

The isolated effect of reducing $v_e$ may have resulted in an increased $C_0$ and may explain the morphological transitions associated with increasing ethanol concentrations. In this hypothesis, sNWs may be the result of $C_0 \ll 1$, where the nanoparticles etch the SiNW quickly, while the ions may be porosifying the SiNW slowly, thereby resulting in the slight roughening of the SiNW tip. Transition to pNWs may occur when $C_0 \cong 1$ and the walls of the SiNWs become porosified readily after exposure to the electrolyte (FIG. 8c). Transition to pNWs+PS occurred when $C_0 > 1$ and the silicon was porosified before the SiNWs were formed (FIG. 8d). The formation of PS layers occurred when $C_0 \gg 1$. This was due to the almost complete inhibition of nanoparticles activity ($C_n \cong 0$) and was only observed at low resistivity and high ethanol concentration (two conditions experimentally observed to decrease $C_n$). Finally, the transition to polished surfaces may be due to the combined increase of $C_i$ and the increase in porosity and pore size associated with higher concentrations of $H_2O_2$.

CONCLUSION

The synthesis of silicon nanowires with multiple layers of different porosities by tuning the concentration of hydrogen peroxide during metal assisted electroless etch was demonstrated. The resulting structures were named porous silicon nanochains. The optical properties of the nanochains were investigated. Layer-specific reflection and emission spectra were observed. Control over size, shape and array density of the nanostructures by means of nanosphere lithography and nanoscale photolithography was demonstrated.

Porous nanowires were biodegradable in simulated physiological conditions. In addition, the degradation rate can be controlled by surface functionalization. Silicon nanostructures with different morphologies were formed (i.e., solid nanowires, porous nanowires, porous nanowires on porous layers, porous silicon layers or polished surfaces) by controlling etch parameters. Such parameters included silicon resistivity, $H_2O_2$ concentration, and ethanol concentration.

Phase diagrams accordingly were developed. A mechanism that explains the observations was proposed. Porous silicon nanowires from substrates with resistivity ranging from 0.0008-0.001 Ω-cm to 1-10 Ω-cm were obtained.

The variable porous structure of silicon nanochains may be exploited as an alternative to porous silicon in electrodes for supercapacitors,[48] or to improve the efficiency of silicon based photovoltaic cells[49]. The spatial control over the reflection and the photoluminescence spectra of the nanochains may be exploited to synthesize nanochain barcodes for simultaneous labeling and detection via bright field and fluorescence microscopy. These multicolor photoluminescent nanochains may find applications as live and in-vivo imaging agents due to their full biodegradability. Porous silicon nanowires are also viable candidates for the development of flexible, biodegradable implantable devices building on the non-biodegradable ones already existing for the detection of biomolecules, such as glucose. Their ease of synthesis, large surface area, biodegradability, mechanical, electronic and optoelectronic properties can be exploited in the development of short-term implantable cantilever based or optoelectronic biosensors for high sensitivity detection.

METHODS

Metal Deposition

Ag or Au nanoparticles from metal salt solutions were deposited by electroless deposition[40] on 4" P-type (100) 0.0008-0.001 Ω-cm (Unisill, Korea), <0.005 Ω-cm, 0.01-0.02 Ω-cm, 0.1-0.2 Ω-cm, and 1-10 Ω-cm (Silicon Quest, Santa Clara, Calif., USA) silicon wafers. The substrates were cleaned and stripped of their native oxide by soaking in 2.9M HF solution. The substrates were then transferred to the deposition solution: 2.9M HF, 0.02M $AgNO_3$ (Sigma-Aldrich, St. Louis, Mo., USA) in the dark for Ag deposition; and 2.9M HF, 0.002M $HAuCl_4$ (Sigma-Aldrich, St. Louis, Mo., USA) for Au deposition. Metal deposition time was regulated (20 seconds to 4 minutes) according to the substrate resistivity to achieve a constant and uniform Au or Ag nanoparticle layer. The metal-deposited substrates were thoroughly rinsed with DI water and dried.

Metal-Assisted Chemical Etching

Following metal catalyst deposition, the Si wafers were etched in a water solution of HF, $H_2O_2$ and ethanol. The effect of HF concentration was studied by etching Ag-deposited wafers for 5 minutes in aqueous solutions of 1.5M, 2.9M, 4.5M or 5.8M HF with 0.2M $H_2O_2$. The $H_2O_2$-resistivity phase diagrams and etch rates were studied by etching the wafers deposited with Ag or Au for 5 minutes in 0.05M, 0.1M, 0.2M, 0.4M, 0.8M, 2M or 4M $H_2O_2$ in 2.9M HF. The ethanol-resistivity phase diagrams and etch rates were studied by etching Ag-deposited wafers for 5 minutes in 0M, 1.7M, 3.4M, 6.9M, or 13.7M ethanol in 2.9M HF with 0.2M $H_2O_2$. Following the etch process, the substrates were rinsed with excess water, dried and prepared for electron microscopy imaging.

Multi-Color Silicon Nanochains

Multicolor porous silicon nanochains were obtained by Ag assisted etch of <0.005 Ω-cm p-type Si wafer at varying $H_2O_2$ concentration. Ag was deposited on the substrate as described in the metal deposition section. The two-step cycle consisted of a 10 minute etch in 0.05M $H_2O_2$ and 2.9M HF. This was followed by a 1 minute etch in 0.2M $H_2O_2$ and 2.9M HF. The cycle was repeated three times to obtain bicolor, six link nanochains. Nanosphere lithography combined with this method was used to fabricate multi-color nanopillars.

Photoluminescence

Two-color silicon nanochain and porous nanowires (Ag assisted, 0.05M and 0.2M $H_2O_2$) were mechanically removed from the substrate and separately collected in isopropyl alcohol. The photoluminescence spectra were acquired using a fluorometer (Quanta Master C, Photon Technologies International, Birmingham, N.J., USA) from 4 ml samples in a quartz cuvette with a 360 nm excitation wavelength. Polystyrene beads in isopropyl alcohol were used as negative control. The photoluminescence images were acquired from samples sealed on a glass slide with a Leica TCS SP5 confocal microscope (Leica Microsystems, Bannockburn, Ill., USA). Q-dot enhanced photoluminescence samples were prepared by loading 100 μl of 2 mg/ml yellow (3.3 nm diameter, 560 nm emitting wavelength, NN-Labs, Fayetteville, Ark., USA) CdSe Q-dots in 20 μl of porous nanowires for 30 minutes. This was followed by 200 μl of 2 mg/ml red (6.6 nm diameter, 633 nm emitting wavelength, NN-Labs, Fayetteville, Ark., USA) CdSe Q-dots for 30 minutes. The samples were rinsed in hexane. The samples were also spread and sealed on glass slides and analyzed with the Leica confocal microscope Patterned Porous Silicon Nanowires Methods of nanosphere lithography to prepare porous silicon nanopillars were employed[45]. A 10% sol water suspension of 160 nm polystyrene spheres (Thermo Fisher Scientific, Waltham, Mass., USA) was diluted to 2% sol in 400:1 (v/v) methanol/Triton1000 (Thermo Fisher Scientific, Waltham, Mass., USA). 50 ml of the suspension was spun at 2500 rpm for 60 seconds on <0.005 Ω-cm p-type Si substrate to obtain a close-packed polystyrene sphere monolayer. The sphere size was reduced to 130 nm by $O_2$ plasma etch (1 min and 20 seconds, 25 sccm $O_2$, 10 mTorr, 100 W RF, Oxford Plasmalab 80, Oxford Instruments, Abingdon, UK). Alternatively standard photolithography was used (Futurrex NR9-250P resist, Futurrex, Franklin, N.J., USA) with nanometric feature masks (HTA Photomask, San Jose, Calif., USA) to obtain nanoribbons (400 nm×2 um patterns, 600 nm pitch) and widely spaced nanopillars (600 nm diameter pattern, 1400 nm pitch). A 20 nm thick Ag film was deposited on the substrate by thermal evaporation with the polystyrene spheres or the photolithographic pattern acting as a stencil mask. The spheres were subsequently removed from the substrate by sonication in Toluene for 30 minutes. The substrate was then etched in a 2.9M HF and 0.1M $H_2O_2$ aqueous solution for 5 minutes.

Biodegradation

Porous and solid SiNWs were synthesized respectively from Ag deposited <0.005 Ω-cm and 0.01-0.02 Ω-cm p-type wafers that were etched for 5 minutes in 0.1M $H_2O_2$, 2.9M HF. Following SiNW formation, the metal nanoparticles were removed by 30 a second silver etch (Type TFS, Transene, Danvers, Mass., USA). The substrates were cleaved into 1 $cm^2$ samples; half of the solid and porous SiNW samples were oxidized by 1 min oxygen plasma (PX-250 Asher, March Plasma Systems, Concord, Calif., USA). Each sample was placed in 50 ml phosphate buffered saline (Thermo Fisher Scientific, Waltham, Mass., USA) on a rocker plate operating at 20 rpm for the entire duration of the experiment. Samples were collected at 0, 2, 4, 8, 16, 20, 24, 48, 72, and 96 hours. The samples were then rinsed with excess DI water, dried and imaged with a Zeiss Neon40 FE-SEM (Carl Zeiss SMT, Peabody, Mass., USA).

WORKING EXAMPLE 2

In this Example, porous silicon nanowires are fabricated by two step metal assisted electroless chemical etching of P-type or N-type silicon wafers. This method in combination with nanolithography or nanopatterning can be applied to fabricate porous silicon nanostructures of different shapes and sizes, such as nanorods, nanobelts, nanostrips, or nanochains. The specific resistivity of the silicon substrate and composition of the etching solution can determine the porosity and pore size (or lack thereof) of the resulting nanostructures. Silicon doping, type of metal catalyst, concentrations of $H_2O_2$, and solvent may all affect the formation of porous nanostructures at various resistivity ranges of silicon. A phase diagram summarizing the relation between porosification and doping, metal type, concentrations of $H_2O_2$, and solvent type can be generated.

Introduction

Metal ion assisted electroless etching of silicon nanowires has attracted a lot of attention as a facile, reliable and high throughput fabrication method. Such silicon nanowires have found application in several fields, including electro-optics, sensors, solar cells, and nanomechanics. Recently, controlled drug delivery application and biodegradation of nonporous silicon nanowires was evaluated. On the other hand, biodegradable porous silicon particles or films can be considered to be promising biomaterials for biomedical applications. Due to their large surface area, porous silicon nanoparticles have been employed as drug delivery carriers for disease treatments. Porous silicon nanowires can combine two crucial features of their precursor materials: nanowires and biodegradable porous silicon. In addition, porous silicon nanowires may provide a wide range of applications, such as biodegradable circuits, thermoelectricity, biosensors, electromechanics, and drug delivery.

Description

High aspect ratio porous silicon nanostructures such as nanowires, nanobelts, nanostrips, and nanochains were fabricated from single crystal silicon by an electroless chemical etch process. Metal films, metal nanofeatures or metal nanoparticles were coated on the silicon substrate first, and a solution of HF and hydrogen peroxide was then used to anisotropically etch the silicon to form the porous silicon nanostructures. Up to hundreds micron long high aspect ratio porous silicon nanostructure can be fabricated. In addition, the patterns of the cross-section of porous silicon structure can be controlled by photolithography, nanolithography, or nanoparticle assisted patterning.

The porosity was related to the resistivity range of the silicon substrate, the metal catalysts, the chemical concentration, and the additive solvent. The fabricated porous silicon nanostructure was biodegradable. In addition, the degradation time can be controlled by surface treatments. The exemplary two step process is described below.

A nanostructured metal layer can be deposited on a silicon substrate by electroless chemical deposition or electrochemical deposition. This step can determine the shape of the final nanowires. Alternatively, metal nanoparticles can be spun-on the silicon surface to form a metal layer. A metal layer can also be physically or chemically deposited on the silicon through a nanopatterned shadow mask.

The metal coated silicon can be etched in a solution of HF, water, and $H_2O_2$, to produce porous silicon nanowires. Solvent can be added to the solution to modulate the feature of porous silicon nanowires. Both P-type silicon and N-type silicon can be used to fabricate porous silicon nanowires.

The silicon nanowires can be made porous only if the resistivity of silicon substrate falls in certain range for a certain solution. The resistivity range of silicon substrate that makes porous nanowires can be tuned by selection of metal type, $H_2O_2$ concentration, or solvent concentration. For instance, both silver and gold can be used in the process to produce porous silicon nanowires. However, gold can produce porous silicon nanowires in a wider resistivity range of silicon than silver. The concentration of $H_2O_2$ can affect the porosity and the resistivity range of silicon for formation of porous silicon nanowires. Solvents, such as ethanol, can be used to partially replace water. In addition, solvents and change the porosity and shift the resistivity range of silicon for porous silicon nanowires.

The solution used for metal assisted chemical etching can be used to etch wafers simultaneously. In addition, the solution may be re-used for subsequent etches. A blank silicon substrate can become porous if it is placed in the same container together with a silicon substrate undergoing the etch step of the metal assisted fabrication of porous silicon nanowires. A blank silicon substrate can become porous if placed in the same solution in which another substrate has been etched to produce porous silicon nanowires by metal assisted etching. The silicon nanowires can be made as nonporous in one solution, and then can be porosified in another solution that targets higher resistivity range for formation of porous nanostructure.

The cross-section of porous silicon structure can be predefined using nanolithography, such as photolithography, e-beam lithography, nanoimprint, or nanoparticle assisted patterning. Using the same process for porous silicon nanowires and by the help of nanolithography, various structures can be produced (e.g., porous silicon nanostrips, porous silicon nanoribbons, porous silicon nanobelts or porous silicon nanorods).

A dielectric layer such as silicon nitride can be used as a masking layer. The dielectric layer can be patterned to define the cross-section of the nanostructure. The patterning can be done using nanoparticles such as polystyrene beads. The patterning can also be done by self-assembly of polymers.

A metal layer can be deposited on a substrate by electroless chemical processes or electrochemical process. Metal layers can also be deposited on a substrate by a physical process, such as thermal evaporation, e-beam evaporation, or sputter. In addition, metal nanoparticles can be coated on the wafer to form a metal layer. The metal deposited substrates with patterns can be used to produce porous silicon structures with defined cross-sections.

The porosity and pore size of the porous silicon structure can be functions of at least one of silicon doping, resistivity, metal, and concentration of chemicals and solvent in the etch solution. The porosification of the layer can occur mostly at the nanowire etch front or further into the substrate. By changing the solution during the etch process, the porosity along the silicon structure can be varied.

Varying porosity along the structure can cut the porous silicon structure into a preferred length. The nanochains with periodic varying porosity can be produced. The mechanical properties of porous silicon nanostructures can be adjusted by the porosity.

The porous silicon nanostructures can be biodegradable. The degradation time can be modulated by the surface chemistry.

1. P-Type Porous Silicon Nanowires Fabricated by Using Two Step Silver Assisted Etch P-type silicon wafers (Silicon Quest) with resistivities of 1-10 Ω-cm, 0.01-0.02 Ω-cm, 0.005 Ω-cm, and 0.0008 Ω-cm were used in this study. A 400 ml solution of 5% HF and 0.02M $AgNO_3$ was prepared in a Teflon dish. The silicon wafer was submerged in the solution for 30 seconds to 1 minute depending on the resistivity to form a silver layer with nanosized features on the silicon surface (FIG. 12a). The silver deposited wafer was rinsed using DI water and dipped in an aqueous solution of 10% HF and 0.3% $H_2O_2$ for 15 minutes. The SEM images were obtained and processed using a Zeiss Neon 40 FE-SEM scanning electron microscope.

FIG. 12 (b) shows the SEM image of nanowires produced from 0.005 Ω-cm silicon wafer. Their porous structure is illustrated in FIG. 12 (c) (SEM) and FIG. 12 (e) (TEM). FIG. 12 (d) shows the SEM image of silicon nanowires produced from a 1-10 Ω-cm silicon wafer. No porous structure was observed, as verified by TEM imaging (FIG. 12 (f)). In this solution, porous nanowires can only be obtained with silicon resistivity of 0.005 Ω-cm or lower.

2: N-Type Porous Silicon Nanowires Fabricated by Using Two Step Silver Assisted Etch N-type silicon wafers (Silicon Quest) with resistivities of 3-5 Ω-cm and 0.004 Ω-cm were used in the study. A 400 ml solution of 5% HF and 0.02M $AgNO_3$ was prepared in a Teflon dish. The silicon wafer was submerged in the solution for 30 seconds to 1 minute depending on resistivity. This process formed a silver layer on the silicon surface (FIG. 13a). The silver deposited wafer was rinsed using DI water, and dipped in the solution of 10% HF, 0.6% $H_2O_2$ and water for 10 minutes to produce the nanowires shown in FIG. 13b. FIG. 13c shows the porous structure of nanowires obtained from 0.004 Ω-cm N-type wafer, while FIG. 13d shows the nonporous nanowires obtained from 3-5 Ω-cm wafer.

3: P-Type Porous Silicon Nanowires Fabricated by Using Two Step Gold Assisted Etch P-type silicon wafer (Silicon Quest) with resistivities of 0.01-0.02 Ω-cm, 0.005 Ω-cm, and 0.0008 Ω-cm were used in this study. A 400 ml solution of 5% HF and 0.002M or 0.02M HAuCl4 was prepared in a Teflon dish. The silicon wafer was submerged in the solution for 1-5 minutes. The gold layer was deposited on the silicon surface (FIGS. 14a,c,e). The wafer was rinsed using DI water. Next, the gold deposited wafer was dipped in an aqueous solution of 10% HF and 0.3% $H_2O_2$ for 15 minutes. Using gold, the porous nanowires can be produced with resistivity of 0.01-0.02 Ω-cm, 0.005 Ω-cm, and 0.0008 Ω-cm. For 0.0008 Ω-cm wafer, the porosity was so high that the nanowires appear like soft hairs.

4: Patterned Porous Silicon Nanorod Array Fabricated by Using Two Step Silver Assisted Etch P-type silicon wafer (Silicon Quest) with resistivity of 0.005 Ω-cm was used to fabricate porous silicon nanorods. A 100 nm silicon nitride (SiN) film was deposited on the silicon substrate by LPCVD. An array of 3 μm circles was patterned by photolithography. A $CF_4$ reactive ion etch (RIE) was applied to remove the silicon nitride from the exposed area. A 400 ml solution of 5% HF and 0.02M $AgNO_3$ was prepared in a Teflon dish. The silicon wafer was submerged in the solution for 1 minute. The wafer was rinsed using DI water. Then the silver deposited wafer was dipped in an aqueous solution of 10% HF and 0.3% $H_2O_2$ water for 2 minutes. The SEM image (FIG. 15) was measured using a Zeiss Neon 40 FE-SEM scanning electron microscope.

5: Formation of Porous Silicon Nanostructure

To study the formation mechanism of porous silicon nanostructure, the evolution of porous structure of microcylinder (enlarged nanocylinder) array was studied. A 100 nm silicon nitride (SiN) film was deposited on the P-type silicon wafer (Silicon Quest) with a resistivity of 0.005 Ω-cm by LPCVD. An array of 3 μm circles was patterned by photolithography. A $CF_4$ RIE was applied to remove the silicon nitride on exposed area. Then the silver was deposited on the substrate, and the substrate was etched in an aqueous solution of 10% HF and 0.3% $H_2O_2$ for 2-5 minutes.

The SEM image (FIG. 16) was obtained using Zeiss Neon 40 FE-SEM scanning electron microscope. FIGS. 16a and 16c show the path of evolution of the nanopore structure from the sidewall to the center. FIG. 16e indicates that the silver nanoparticles were removing the silicon underneath them. FIG. 16f shows the nanopores around the silver nanoparticles after the nanoparticles were removed. It indicates in this case, the formation of nanopores preceded the nanoparticles etch front.

6: Dependence of the Porosity of Silicon Nanowires on $H_2O_2$ Concentration

P-type silicon wafer (Silicon Quest) with resistivities of 1-10 Ω-cm, 0.01-0.02 Ω-cm, 0.005 Ω-cm, and 0.0008 Ω-cm were used in this study. A 400 ml solution of 5% HF and 0.02M $AgNO_3$ was prepared in a Teflon dish. The silicon wafer was submerged in the solution for 30 seconds to 1 minute. The wafer was rinsed using DI water. Three 10% HF solutions with 0.15%, 0.3% and 0.6% $H_2O_2$ were prepared. The wafers were etched in one of the solutions for 15 minutes. The concentration of $H_2O_2$ determined the porosity of the resulting nanowires (FIG. 17). The $H_2O_2$ concentration also affected the resistivity range of silicon for porous nanowire formation (FIG. 18).

The above results indicate that the concentration of $H_2O_2$ determines the porosity of silicon nanowires. For instance, to etch 40 μm long porous nanowires on both sides of a 4" wafer, about 1 L of a 0.6M $H_2O_2$ solution may be needed in order to keep a uniform porous structure. Thus, an $H_2O_2$ injection method, such as a syringe pump, may be used to maintain $H_2O_2$ levels at a steady concentration.

7: Effect of HF Concentration on Silicon Nanowires

P-type silicon wafer (Silicon Quest) with a resistivity of 0.005 Ω-cm was used in this study. A 400 ml solution of 5% HF and 0.02M $AgNO_3$ was prepared in a Teflon dish. Next, silver was deposited by electroless deposition in this solution. The wafer was rinsed using DI water and dried. Three solutions of 5%, 10%, 15% and 20% HF were prepared. The wafers were etched in the solution for 5-15 minutes. Higher HF concentration resulted in a faster etching rate (FIG. 19). No significant effect on porosity was observed.

8: Effect of Ethanol on Porosity of Silicon Nanowires

A silver nanostructured layer was deposited on the P-type silicon wafer (Silicon Quest) with a resistivity of 0.005 Ω-cm by electroless deposition in a 400 ml solution of 5% HF and 0.02M $AgNO_3$. The wafer was rinsed using DI water and dried. Three solutions with 0.6% $H_2O_2$ and 0%, 30%, 40% and 80% ethanol were prepared. Each wafer was etched in the 0% solution for 2 minutes and then etched in one of the 30%, 40%, or 80% solution for 2 minutes. The results showed that the presence of ethanol as solvent produced high porosity silicon nanowires.

9: Varying Porosity Along Silicon Wire by Changing the $H_2O_2$ Concentration of Solution Using Two Step Silver Assisted Etch A silver nanostructured layer was deposited on the P-type silicon wafer (Silicon Quest) with a resistivity of 0.005 Ω-cm by electroless deposition in a 400 ml solution of 5% HF and 0.02M $AgNO_3$. The wafer was rinsed using DI water and dried. Three 10% HF solutions with 0.15%, 0.3% and 0.6% $H_2O_2$ were prepared. A wafer was etched in the 0.15% solution for 2 min and then etched in the 0.6% solution for 2 min. The process was repeated for 3 cycles.

Another wafer was etched in the 0.3% solution for 2 minutes. The same wafer was then etched in the 0.6% solution for 2 minutes. The process was repeated for 3 cycles. The resulting porous silicon nanowires are shown in FIG. 20.

10: Porous Silicon Nanochain Fabricated Using Two Step Silver Assisted Etch

A silver nanostructured layer was deposited on a P-type silicon wafer (Silicon Quest) with a resistivity of 0.005 Ω-cm by electroless deposition in a 400 ml solution of 5% HF and 0.02M AgNO3. The wafer was rinsed using DI water and dried. Two solutions of 0.15% $H_2O_2$ and 0.6% $H_2O_2$ were prepared. The wafers were etched in the 0.15% solution for 10 minutes and then etched in the 0.6% solution for 1 minute. The process was repeated for 5 cycles. The resulting porous silicon nanochain was flexible.

11: Biodegradation of Porous Silicon Nanowires

Porous silicon nanowires were fabricated from P-type silicon wafer (Silicon Quest) with resistivities of 0.01-0.02

Ω-cm and 0.005 Ω-cm. The silver layer was removed in Gold etchant (Transene) and rinsed. Sample wafers with silicon nanowires were cut in 1 cm×1 cm pieces. One of the 0.005 Ω-cm samples was oxidized in oxygen plasma for 1 min. The samples were placed in 50 ml phosphate buffered saline (PBS) solution in a plastic beaker. All beakers were mounted on a rotary plate operated at 20 RPM. Samples were removed from PBS after 2, 4, 8, 16, 20, 24, 48, 72, and 96 hours. The samples were then rinsed with excess water and imaged in a Zeiss Neon40 FE-SEM. Non-oxidized porous silicon nanowires produced from 0.005 Ω-cm wafer degraded in less than 24 hours. Oxidized nanowires from the same wafer degraded in 72 hours. Non-porous silicon nanowires from the 0.01-0.02 Ω-cm wafer did not degrade in 96 hours.

12: Porous Silicon Nanowires with Pre-Defined Diameters Fabricated by Polystyrene Beads Nanopatterning A 10% water solution of polystyrene nanoparticles with 100 nm diameter (Sigma-Aldrich) was diluted with methanol and water and spin-coated on silicon substrate to form a monolayer film (FIG. 22a). The film was treated in oxygen plasma for 30 seconds. Next, a 10-40 nm thick silver layer was deposited in a CHA E-beam evaporator (FIG. 22b). The wafers were etched in the 0.3% $H_2O_2$ and 10% HF solution for 10 min. Porous silicon nanowires with 70 nm diameters were obtained.

13: Additional Variations

The above-described methods can have numerous variations. For instance, the metal assisted chemical synthesis of nanowires integrated with lithography patterning can be used to fabricate solid nano/micro-pillars with aspect ratios as high as thousands (FIG. 23a). This method could be a low-cost alternative for reactive ion deep silicon etching. The nano/micro-pillars can also be further used for production of multilayer porous silicon particles through a multi-step electrochemical porosification process.

In addition, multi-segment nanowire techniques can be used for direct synthesis of multilayer porous silicon particles. By applying lithography (nanosphere lithography, photolithography, nanoimprint, e-beam lithography) to define the dimension, a multi-segment stack of porous silicon structure can be formed by periodically varying the etching solution during synthesis (FIG. 23b). Furthermore, the high porosity portion of the stacks can be used as a mechanical separating point to release the particles (FIG. 23c). Likewise, the metal nanoparticle assisted etch can be used to etch through a multilayered porous silicon film to make multilayer stacks of particles (FIG. 23d).

REFERENCES

1. Bisi, O., et al. *Surf. Sci. Rep.* 38, 1 (2000).
2. Lehmann, V. & Gosele, U. *Appl. Phys. Lett.* 58, 856-858 (1991).
3. Wolkin, M. V., et al. *Phys. Rev. Lett.* 82, 197 (1999).
4. Dorvee, J. R., et al. *Nat. Mater.* 3, 896-899 (2004).
5. Lin, V. S., et al. *Science* 278, 840-843 (1997).
6. Pancheri, L., et al. *Sens. Actuators, B: Chemical* 89, 237-239 (2003).
7. Shen, Z. et al. *Anal. Chem.* 73, 612-619 (2001).
8. Park, J. et al. *Nat. Mater.* 8, 331-336 (2009).
9. Serda, R., et al. M In Nanomaterials for the Life Sciences Vol. 2: Nanostructured Oxides (ed. C.S.S.R. Kumar) Ch 11, 357-406 (Wiley-WCH, Weinheim, 2009).
10. Starodub, V. M., et al. *Sens. Actuators, B* 58, 409-414 (1999).
11. Canham, L. T. Bioactive Silicon Structure Fabrication Through Nanoetching Techniques. *Adv. Mater.* 7, 1033-1037 (1995).
12. Canham, L. et al. Derivatized Porous Silicon Mirrors: Implantable Optical Components with Slow Resorbability. *Phys. Status Solidi A* 182, 521-525 (2000).
13. Goh, A. S. W. et al. A novel approach to brachytherapy in hepatocellular carcinoma using a phosphorous32 (32P) brachytherapy delivery device—a first-in-man study. *Int. J. Radiat. Oncol. Biol. Phys.* 67, 786-792 (2007).
14. Tasciotti, E. et al. Mesoporous silicon particles as a multistage delivery system for imaging and therapeutic applications. *Nature Nanotechnol.* 3, 151-157 (2008).
15. Chiappini, C. et. al. Tailored porous silicon microparticles: fabrication and properties, ChemPhysChem, accepted, doi:10.1002/cphc.200900914
16. Prestidge, C. A. et al. Mesoporous silicon: a platform for the delivery of therapeutics. *Expert Opin. Drug Delivery* 4, 101-110 (2007).
17. Sun, W., Puzas, J. E., Sheu, T. J. & Fauchet, P. M. Porous silicon as a cell interface for bone tissue engineering. *Phys. Status Solidi A* 204, 1429-1433 (2007).
18. M. A. Whitehead et. al. High-Porosity Poly(∈-Caprolactone)/Mesoporous Silicon Scaffolds: Calcium Phosphate Deposition and Biological Response to Bone Precursor Cells. *Tissue Eng.* 14 195-206 (2008).
19. Mayne, A. H., Bayliss, S. C., Barr, P., Tobin, M. & Buckberry, L. D. Biologically Interfaced Porous Silicon Devices. *Phys. Status Solidi A* 182, 505-513 (2000).
20. Stewart, M. P. & Buriak, J. M. Chemical and Biological Applications of Porous Silicon Technology. *Adv. Mater.* 12, 859-869 (2000).
21. Mathew, F. P. & Alocilja, E. C. Porous silicon-based biosensor for pathogen detection. *Biosens. Bioelectron.* 20, 1656-1661 (2005).
22. Vázsonyi, É. et al. Porous silicon formation by stain etching. *Thin Solid Films* 388, 295-302 (2001).
23. Heitmann, J., Müller, F., Zacharias, M. & Gösele, U. Silicon Nanocrystals: Size Matters. *Adv. Mater.* 17, 795-803 (2005).
24. Tsakalakos, L. et al. Silicon nanowire solar cells. *Appl. Phys. Lett.* 91, 233117-3 (2007).
25. Chan, C. K. et al. High-performance lithium battery anodes using silicon nanowires. *Nature Nanotechnol.* 3, 31-35 (2008).
26. Cui, Y., Zhong, Z., Wang, D., Wang, W. U. & Lieber, C. M. High Performance Silicon Nanowire Field Effect Transistors. *Nano Letters* 3, 149-152 (2003).
27. Hu, J., Ouyang, M., Yang, P. & Lieber, C. M. Controlled growth and electrical properties of heterojunctions of carbon nanotubes and silicon nanowires. *Nature* 399, 48-51 (1999).
28. Boukai, A. I. et al. Silicon nanowires as efficient thermoelectric materials. *Nature* 451, 168-171 (2008).
29. McAlpine, M. C. et al. High-Performance Nanowire Electronics and Photonics on Glass and Plastic Substrates. *Nano Letters* 3, 1531-1535 (2003).
30. Teo, E. J. et al. Multicolor Photoluminescence from Porous Silicon Using Focused, High-Energy Helium Ions. *Adv. Mater.* 18, NA (2006).
31. Huang, Y., Duan, X. & Lieber, C. Nanowires for Integrated Multicolor Nanophotonics. *Small* 1, 142-147 (2005).
32. Byun, K., Heo, K., Shim, S., Choi, H. & Hong, S. Functionalization of Silicon Nanowires with Actomyosin Motor Protein for Bioinspired Nanomechanical Applications. *Small* 5, 2659-2664 (2009).

33. Kim, W., Ng, J. K., Kunitake, M. E., Conklin, B. R. & Yang, P. Interfacing Silicon Nanowires with Mammalian Cells. *J. Am. Chem. Soc.* 129, 7228-7229 (2007).
34. Chen, W. et al. Silicon nanowires for high-sensitivity glucose detection. *Appl. Phys. Lett.* 88, 213104-3 (2006).
35. Zheng, G. et al. Multiplexed electrical detection of cancer markers with nanowire sensor arrays. *Nature Biotechnol.* 23, 1294-1302 (2005).
36. Li, Z. et al. Sequence-Specific Label-Free DNA Sensors Based on Silicon Nanowires. *Nano Letters* 4, 245-247 (2004).
37. Patolsky, F. et al. Electrical detection of single viruses. *Proc. Natl. Acad. Sci. USA* 101, 14017-14022 (2004).
38. Wang, W. U., Chen, C., Lin, K., Fang, Y. & Lieber, C. M. Label-free detection of small-molecule-protein interactions by using nanowire nanosensors. *Proc. Natl. Acad. Sci. USA* 102, 3208-3212 (2005).
39. Li, X. & Bohn, P. W. Metal-assisted chemical etching in $HF/H_2O_2$ produces porous silicon. *Appl. Phys. Lett.* 77, 2572-2574 (2000).
40. Peng, K. et al. Uniform, Axial-Orientation Alignment of One-Dimensional Single-Crystal Silicon Nanostructure Arrays13. *Angew. Chem. Int. Ed.* 44, 2737-2742 (2005).
41. Tian, B., Xie, P., Kempa, T. J., Bell, D. C. & Lieber, C. M. Single-crystalline kinked semiconductor nanowire superstructures. *Nature Nanotechnol* advance online publication, doi:10.1038/nnano.2009.304 (2009).
42. Hochbaum, A. I., Gargas, D., Hwang, Y. J. & Yang, P. Single Crystalline Mesoporous Silicon Nanowires. *Nano Letters* 9, 3550-3554 (2009).
43. Qu, Y. et al. Electrically Conductive and Optically Active Porous Silicon Nanowires. *Nano Letters*, advance online publication, doi: 10.1021/nl903030h
44. Credo, G. M., Mason, M. D. & Buratto, S. K. External quantum efficiency of single porous silicon nanoparticles. *Appl. Phys. Lett.* 74, 1978-1980 (1999).
45. Peng, K. et al. Ordered silicon nanowire arrays via nanosphere lithography and metal-induced etching. *Appl. Phys. Lett.* 90, 163123-3 (2007).
46. Bettinger, C. J. & Bao, Z. Organic Thin-Film Transistors Fabricated on Resorbable Biomaterial Substrates. *Adv. Mater.* 9999, NA (2009).
47. Anderson, S. H. C., Elliott, H., Wallis, D. J., Canham, L. T. & Powell, J. J. Dissolution of different forms of partially porous silicon wafers under simulated physiological conditions. *Phys Status Solidi A* 197, 331-335 (2003).
48. Rowlands, S., Latham, R. & Schlindwein, W. Supercapacitor devices using porous silicon electrodes. *Ionics* 5, 144-149 (1999).
49. Vitanov, P. et al. High-efficiency solar cell using a thin porous silicon layer. *Thin Solid Films* 297, 299-303 (1997).

Without further elaboration, it is believed that one skilled in the art can, using the description herein, utilize the present invention to its fullest extent. The embodiments described herein are to be construed as illustrative and not as constraining the remainder of the disclosure in any way whatsoever. While the preferred embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of making a porous nanowire or nanowire-like structure comprising:
    obtaining an etchable substrate;
    performing metal-assisted electroless etch comprising the steps of:
        (i) forming on a surface of the substrate a patterned porosification assisting metal layer that has at least one opening, wherein said opening has at least one lateral dimension of no more than 5 microns; and
        (ii) exposing the substrate to an etching solution, wherein said etching solution dissolves the patterned porosification assisting layer to form a metal containing etching solution, and
    wherein the metal containing etching solution etches a first portion of the substrate to form an elongated structure, and porosifies a portion of the elongated structure to form a nanoporous nanowire or nanowire-like structure having a cross-section determined by the opening, wherein the cross-section is substantially perpendicular to the axis, the cross-section has at least one lateral dimension of no more than 5 microns, and said porous nanowire or nanowire-like structure has an aspect ratio no less than 4.

2. The method of claim 1, wherein the substrate is a silicon substrate.

3. The method of claim 2, wherein the substrate has a uniform doping level.

4. The method of claim 2, wherein the silicon substrate has a resistivity of greater than 0.02 Ω·cm.

5. The method of claim 2, wherein the substrate comprises a first doping region and a second doping region, wherein the second doping region is different from the first doping region in at least one property selected from the group consisting of a dopant type and a dopant concentration, and wherein the formed object comprises a first doping region formed from the first doping region of the substrate, and a second doping region formed from the second doping region of the substrate.

6. The method of claim 5, wherein the formed object comprises a junction between the first doping region and the second doping region.

7. The method of claim 1, wherein said forming step comprises:
    using a shadow mask that defines a cross-section of the opening; and
    depositing a porosification assisting metal layer over the shadow mask.

8. The method of claim 7, wherein said forming step further comprises depositing the shadow mask on the surface of the substrate.

9. The method of claim 8, further comprising removing the stencil mask to form the patterned porosification assisting metal layer.

10. The method of claim 8, wherein said forming said stencil mask is performed by a microlithography or a nanolithogaphy.

11. The method of claim 10, wherein said forming said stencil mask is performed by nanoparticles assisted patterning.

12. The method of claim 10, wherein said forming said stencil mask is performed by photolithography.

13. The method of claim 7, wherein said depositing the porosification assisting metal layer over the stencil mask comprises depositing the porosification assisting metal by an electroless chemical process.

14. The method of claim 7, wherein said depositing the porosification assisting metal layer over the stencil mask comprises depositing the porosification assisting metal electrochemically.

15. The method of claim 4, wherein said depositing the porosification assisting metal layer over the stencil mask comprises depositing the porosification assisting metal by a physical vapor deposition.

16. The method of claim 7, wherein said stencil mask comprises a dielectric material.

17. The method of claim 15, wherein said dielectric material is silicon nitride.

18. The method of claim 7, wherein said stencil mask comprises a self-assembled polymeric layer.

19. The method of claim 7, wherein said patterned porosification assisting metal comprises a noble metal.

20. The method of claim 1, wherein said patterned layer has a thickness of less than 50 nm.

21. The method of claim 1, wherein said opening has at least one lateral dimension of no more than 2 microns.

22. The method of claim 21, wherein said opening has at least one lateral dimension of no more than 0.5 microns.

23. The method of claim 22, wherein said opening has at least one lateral dimension of no more than 0.2 microns.

24. The method of claim 1, wherein said opening has a circular or rectangular shape.

25. The method of claim 1, wherein said etching solution comprises HF and an oxidizer.

26. The method of claim 25, wherein said oxidizer is $H_2O_2$.

27. The method of claim 25, wherein said solution further comprises at least one surfactant.

28. The method of claim 27, wherein the surfactant is ethanol.

29. The method of claim 1, further comprising:
selecting at least one parameter that is selected from the group consisting of pore size, porosity and pore orientation of the porous object, wherein the selecting occurs by selecting one or more concentrations of components of the etching solution that are effective for the selected at least one parameter, and wherein the selecting occurs prior to said exposing.

30. The method of claim 1, wherein said exposing comprises:
(a) exposing the substrate to a first etching solution to form a first region of the object; and
(b) exposing the substrate to a second etching solution to form a second region of the object,
wherein said second region is adjacent to the first region along an axis of the object, and
wherein said second region has at least one porous property different from that of the first region, wherein said property is selected from the group consisting of a pore size, porosity and pore orientation.

31. The method of claim 1, wherein said patterned porosification assisting metal layer has a plurality of openings, and wherein said exposing results in forming a plurality of porous objects.

32. The method of claim 1, further comprising loading a first load in pores of the porous object.

33. The method of claim 1, further comprising modifying a surface of pores of the formed porous object.

34. The method of claim 33, wherein said modifying results in an increase of the biodegradation time of the porous object.

35. A method of forming a porous nanowire or nanowire-like structure, comprising:
obtaining an etchable semiconductor substrate;
performing metal-assisted electroless etch comprising the steps of:
(i) forming on a surface of the substrate a patterned porosification assisting metal layer that has at least one opening, wherein said opening has at least one lateral dimension of no more than 5 microns; and
(ii) subsequently exposing the substrate to a first etching solution and a second etching solution to form respectively a first region and a second region of a porous nanowire or nanowire-like structure, wherein said exposing results in dissolving the etch assisting metal in at least one of the first and second etching solutions to form a metal containing etching solution,
wherein the metal containing etching solution porosifies a portion of the substrate to form a first porous region having a cross-section determined by the opening, wherein the cross-section is substantially perpendicular to the axis, the cross-section has at least one lateral dimension of no more than 5 microns, and
wherein said second region is adjacent to the first region along an axis of the nanowire or nanowire-like structure and has at least one porous property different from that of the first region,
wherein said property is selected from the group consisting of a pore size, porosity and pore orientation.

36. The method of claim 35, wherein the substrate is a silicon substrate.

37. The method of claim 36, wherein the silicon substrate has a resistivity of greater than 0.02 $\Omega \cdot cm$.

38. The method of claim 35, wherein said depositing the porosification assisting metal is performed by an electroless chemical process.

39. The method of claim 35, wherein said depositing the porosification assisting metal is performed electrochemically.

40. The method of claim 35, wherein said depositing the porosification assisting metal comprises depositing nanoparticles of the porosification assisting metal.

41. The method of claim 35, wherein said depositing the porosification assisting metal comprises depositing by a physical vapor deposition.

42. The method of claim 35, wherein said porosification assisting metal comprises a noble metal.

43. The method of claim 35, wherein each of the first and second etching solutions comprises HF, an oxidizer and optionally a surfactant, and wherein a concentration of at least one of HF, the oxidizer and the optional surfactant in the first solution is different than a corresponding concentration in the second solution.

44. The method of claim 43, wherein the oxidizer is $H_2O_2$, and wherein the concentration of $H_2O_2$ in the first solution is different from the concentration of $H_2O_2$ in the second solution.

45. The method of claim 35, wherein the first region and the second region are porous regions.

46. The method of claim 35, further comprising loading a first load in pores of the first region.

47. The method of claim 46, wherein said first load comprises nanoparticles.

48. The method of claim 47, wherein said first load comprises quantum dots.

49. The method of claim 46, further comprising loading a second load in pores of the second region.

50. A method of making a porous object comprising:
(i) obtaining a silicon substrate having a resistance higher than 0.02 Ω·cm;
(ii) depositing a porosification assisting metal on a surface of the substrate; and
(iii) subsequently exposing the substrate to an etching solution,
wherein the etching solution comprises HF and an oxidant,
and wherein the HF and the oxidant are at concentration levels effective to form a porous object.

51. The method of claim 50, wherein the resistance of the silicon substrate is greater than 0.1 Ω·cm.

52. The method of claim 50, wherein said depositing the porosification assisting metal is performed by an electroless chemical process.

53. The method of claim 50, wherein said depositing the porosification assisting metal is performed electrochemically.

54. The method of claim 50, wherein said depositing the porosification assisting metal comprises depositing nanoparticles of the porosification assisting metal.

55. The method of claim 50, wherein said depositing comprises depositing a porosification assisting metal layer over a shadow mask.

56. The method of claim 55, further comprising forming the shadow mask on the surface of the substrate.

57. The method of claim 56, further comprising removing the stencil mask to form a patterned porosification assisting metal layer.

58. The method of claim 50, wherein said porosification assisting metal comprises a noble metal.

59. The method of claim 50, wherein the oxidizer is $H_2O_2$.

60. The method of claim 50, wherein the etching solution further comprises a surfactant.

61. The method of claim 60, wherein the surfactant is ethanol.

62. A method of making a nanowire or nanowire-like structure comprising:
(i) obtaining a non-porous object that has a cross-section that is substantially perpendicular to an axis of the object,
wherein said cross-section has at least one lateral dimension of no more than 5 microns, and
wherein an aspect ratio of said object is at least 4; and
(ii) forming a nanowire or nanowire-like structure from the non-porous object by metal-assisted electroless etch, wherein the forming step comprises:
depositing a porosification assisting metal on a surface of the non-porous object; and
exposing the non-porous object to an etching solution that dissolves the etch-assisting metal to form a metal containing solution that etches away a portion of the non-porous object to form a non-porous elongated structure,
wherein the porosifying solution comprises:
an effective concentration of HF,
an oxidizer, and
at least one of ions and atoms of a porosification assisting metal.

63. The method of claim 62, wherein the oxidizer is $H_2O_2$.

64. A method of making a multi-doped structure comprising:
obtaining a semiconductor substrate that comprises a first doping region and a second doping region,
wherein the second doping region is different from the first doping region in at least one of a dopant type and a dopant concentration; and
performing metal-assisted electroless etch comprising the steps of:
(i) depositing an etching assisting metal on a surface of the substrate and exposing the substrate to an etching solution, wherein the etching solution dissolves the etching assisting metal to form a metal containing etching solution, wherein the metal containing etching solution etches away a portion of the substrate to form a multi-doped structure that has a cross-section that is substantially perpendicular to an axis of the structure, wherein said cross-section has at least one lateral dimension of no more than 5 microns and an aspect ratio of at least 4, and wherein said structure comprises a first doping region formed from the first doping region of the substrate and a second doping region formed from the second doping region of the substrate.

65. The method of claim 64, wherein the semiconductor substrate comprises silicon.

66. The method of claim 64, wherein the structure is a non-porous structure.

67. The method of claim 64, wherein the structure comprises at least one porous region.

68. The method of claim 64, wherein the etching assisting metal comprises at least one noble metal.

69. The method of claim 64, wherein the etching solution comprises HF and an oxidizer.

70. The method of claim 69, wherein the oxidizer is $H_2O_2$.

* * * * *